United States Patent [19]

Yoshida et al.

[11] Patent Number: 4,949,667

[45] Date of Patent: Aug. 21, 1990

[54] ROLL COATING APPARATUS FOR FORMING A FILM OF A HIGH VISCOSITY COATING LIQUID ON A SURFACE

[75] Inventors: Toshio Yoshida; Kenichi Nakamura; Yoshihisa Matsuda; Eiichiro Hayashi; Kazuo Kinose; Megumu Fukui, all of Shiga, Japan

[73] Assignee: Dainippon Screen Mfg. Co., Ltd., Japan

[21] Appl. No.: 339,017

[22] Filed: Apr. 14, 1989

[30] Foreign Application Priority Data

Apr. 20, 1988 [JP] Japan ............................ 63-98730
Jun. 7, 1988 [JP] Japan ......................... 63-75650[U]
Jul. 14, 1988 [JP] Japan ......................... 63-93142[U]

[51] Int. Cl.$^5$ .............................................. B05C 1/05
[52] U.S. Cl. .................................... 118/60; 118/202; 118/224; 118/249; 118/258; 118/261; 118/262
[58] Field of Search ............... 118/202, 249, 262, 261, 118/224, 244, 258, 60, 101

[56] References Cited

U.S. PATENT DOCUMENTS

| | | | |
|---|---|---|---|
| 2,888,902 | 6/1959 | Wells et al. | 118/262 |
| 3,279,425 | 10/1966 | Gottscho | 118/202 |
| 3,383,234 | 5/1968 | Nikkel | 118/262 |
| 3,788,271 | 1/1974 | Carpenter et al. | 118/262 |
| 4,245,583 | 1/1981 | Schollkopf et al. | 118/249 |
| 4,261,286 | 4/1981 | Kupfer | 118/202 |
| 4,300,476 | 11/1981 | Jurascheck et al. | 118/249 |
| 4,503,801 | 3/1985 | Collishaw et al. | 118/249 |

FOREIGN PATENT DOCUMENTS

2346824  3/1975  Fed. Rep. of Germany ...... 118/202

Primary Examiner—Willard Hoag
Attorney, Agent, or Firm—Ostrolenk, Faber, Gerb & Soffen

[57] ABSTRACT

A roll coating apparatus for applying a coating liquid having a high viscosity at a normal temperature, to a surface of a substrate, including a device for feeding the substrate, a coating roll rotatably provided in contact with the fed substrate, and a doctor for regulating the coating liquid adhering to the coating roll to a prescribed amount. Respective axial lines of the coating roll and the doctor are inclined with a prescribed angle with respect to the horizontal plane and a coating liquid supply device is provided at the highest position thereof. The coating liquid supplied at the highest end of the coating roll adheres to the surface of the coating roll. The quantity thereof is controlled by the doctor. The coating liquid flows downward on the surface of the coating roll due to its weight and rotation of the coating roll. Accordingly, the coating liquid on the surface of the coating roll is constantly renewed and no irregularities occur to the density of the liquid. The coating liquid is transferred from the coating roll, to form a film having a prescribed uniform thickness on the substrate. This roll coating apparatus may further include a device for heating parts of the apparatus or the substrate to lower the viscosity of the coating liquid. Thus, it becomes possible to form a film of a more uniform and regulated thickness easily.

48 Claims, 16 Drawing Sheets

ROLL COATING APPARATUS FOR FORMING A FILM OF A HIGH VISCOSITY COATING LIQUID ON A SURFACE

BACKGROUND OF THE INVENTION

1. Field of the Invention

The present invention relates to an apparatus for applying a coating liquid to a surface of a thin plate by means of a coating roll and particularly to a roll coating apparatus for applying a coating liquid having a high viscosity such as photoresist or polyimide resin with a uniform thickness to a surface of a thin substrate such as a printed circuit board, a glass substrate for a liquid crystal display panel or a substrate for an image sensor.

2. Description of the Background Art

An apparatus for forming a layer of a coating liquid on a surface of a thin substrate such as a printed circuit board by using a coating roll is disclosed for example in Japanese Utility Model Publication No. 42133/1984 entitled "Coating Apparatus for a Liquid of a High Viscosity", or Japanese Patent Laying-Open No. 230658/1985 entitled "Coating Apparatus for Applying a Photosensitive Liquid to a Printed Circuit Board".

FIG. 1 is a perspective view showing schematically a typical example of such a conventional apparatus. FIG. 2 is a sectional view in the direction of the arrow II in FIG. 1. Referring to FIGS. 1 and 2, the conventional apparatus comprises a coating roll 30 pressed against the upper surface of a substrate p transported in the direction of the arrow D, a doctor roll 32 extending along an axis of the coating roll 30 and contacting the coating roll 30 on a side thereof, a backup roll 34 extending under the coating roll 30 along its axis and in contact with a lower side of the coating roll 30, for supporting the substrate p inserted between the rolls 30 and 34, and a coating liquid supply nozzle 36 provided movably along the axis of the coating roll 30 over a portion of contact between the coating roll 30 and the doctor roll 32, for supplying a coating liquid 42 to the coating roll 30. The coating roll 30 and the backup roll 34 rotate according to movement of the substrate p. The doctor roll 32 is rotatable around its axis. The portion of contact between the doctor roll 32 and the backup roll 34 constitutes a liquid reservoir 38.

FIG. 3 is a sectional view taken along the line III—III in FIG. 2, showing a section of a peripheral surface of the coating roll 30. As shown in FIG. 3, the circumferential surface of the coating roll 30 is provided with a plurality of grooves 40 along the circular direction of the coating roll. According to the disclosure of Japanese Patent Laying-Open No. 230658/1985, the width W of each groove 40 is in the range from 0.1 mm to 3 mm and preferably W=0.5 mm. The distance F between adjacent grooves 40 is in the range from 0.1 mm to 5 mm and preferably F=0.5 mm.

Referring to FIGS. 1 to 3, operation of the conventional apparatus will be described. The coating liquid supply nozzle 36 reciprocates along the axial direction of the coating roll 30, to supply the coating liquid 42 to the liquid reservoir 38. The coating roll 30 rotates with a prescribed number of revolutions per minute, so that the coating liquid 40 adhering to a peripheral surface of the coating roll 30 from the liquid reservoir 38 is uniformly applied to the surface of the coating roll 30.

The substrate p moves in the feeding direction D and it is inserted between the coating roll 30 and the backup roll 34. The coating liquid spreading around the surface of the coating roll 30 adheres to the substrate p as a result of contact between the coating roll 30 and the surface of the substrate p, whereby a film 44 is formed. The coating liquid supply nozzle 36 supplies the coating liquid 42 continuously to the liquid reservoir 38 while reciprocating along the axial direction of the coating roll 30, over the liquid reservoir 38. Accordingly, the film 44 is successively formed on surfaces of a plurality of substrates p transported.

FIG. 4 is a perspective view showing schematically another example of a conventional apparatus. Referring to FIG. 4, this apparatus comprises a doctor bar 46 which extends along the axial direction of the coating roll 30 and contacts a side surface of the coating roll 30, in place of the doctor roll 32 of the apparatus shown in FIGS. 1 and 2. The doctor bar 46 has a cut in a portion contacting the coating roll 30, whereby a liquid reservoir 48 is formed.

The apparatus shown in FIG. 4 is also capable of forming a film 44 on the substrate p in the same manner as in the case of the apparatus shown in FIGS. 1 and 2.

The conventional apparatus shown in FIGS. 1 to 4 have, however, disadvantages as described below.

One of the disadvantages is that when a coating liquid having a high viscosity, e.g., 1,000 cp or more at a normal temperature, is applied to a substrate, the surface of the film formed on the substrate is not smooth in some conventional apparatus. For example, the coating liquid used in the coating apparatus described in the above mentioned Japanese Patent Laying-Open No. 230658/1985 is an etching-resisting photosensitive liquid (photoresist for etching) and it has a viscosity of about several tens to hundreds of cp. On the other hand, a solder-resisting photosensitive liquid has a viscosity of about 20,000 cp or more at a liquid temperature of 20° C. If a solder-resisting photosensitive liquid is applied to a surface of a substrate by using a conventional roll coating apparatus, it is known that the surface of the film obtained is not uniform due to the high viscosity. Moreover, it is also known that there are some parts of the surface of the substrate, where the film is not formed.

Polyimide resin used as an interlayer insulating film for a liquid crystal glass substrate or other substrate has a viscosity of several thousands of cp at a liquid temperature of 28° C. If polyimide resin is applied to the surface of the substrate using the coating roll 30 having grooves as shown in FIG. 3, a film having a non-uniform surface or a partially deficient film is obtained.

FIG. 5 is an enlarged view of a part of the conventional apparatus shown in FIG. 2. Referring to FIG. 5, the reason for the formation of the above mentioned non-uniform or incomplete film will be described. If the viscosity of the coating liquid 42 is increased, the coating liquid 42 adheres not only to the coating roll 30 but also to the doctor roll 32 under the position of contact between the coating roll 30 and the doctor roll 32. A required quantity of the coating liquid 42 does not adhere to the surface of the coating roll 30. As a result, it is difficult to form the film 44 having a required thickness on the surface of the substrate p.

Threadlike portions 54 of the coating material are generated between the coating liquid 50 adhering to the coating roll 30 and the coating liquid 52 adhering to the doctor roll 32. Due to those threadlike portions 54, unevenness is caused in the thickness of the coating film 44 formed on the surface of the substrate p.

Threadlike portions 56 of the coating material are generated also between the surface of the coating roll 30 and that of the substrate p after the coating roll 30 has contacted the substrate p. As a result, the surface of the coating film 44 formed on the surface of the substrate p is not uniform.

As is evident from the above description, a film 44 having a uniform surface cannot be formed with a coating liquid having a high viscosity, e.g., a viscosity of 1,000 cp or more at a normal temperature on the substrate p by any of the conventional apparatus.

Another disadvantage is that small air bubbles are contained in the film 44 formed by the conventional apparatus. This phenomenon is caused by the threadlike portions 56 of the coating material generated between the coating roll 30 and the film 44. The threadlike portions 56 of the coating material become gradually thin according to the rotation of the coating roll 30 and the movement of the substrate p. When the threadlike portions 56 are broken finally, they are absorbed in the film 44 on the surface of the substrate p with air being taken therein. As a result, small air bubbles are formed in the film 44 on the surface of the substrate p.

A further disadvantage is that the thickness of the film formed on the substrate is sometimes not uniform according to the conventional techniques. The reason for this phenomenon will be described.

As shown in FIGS. 1 and 3, if a coating liquid of a high viscosity is applied to the substrate p, the coating liquid on the surface of the coating roll 30 is thin in a portion transferred to the substrate p and thick in the other portions. In order to compensate for this difference of thicknesses of the coating liquid on the surface of the coating roll 30, the conventional apparatus includes the coating liquid supply nozzle 36 shown in FIGS. 1 and 4.

The coating liquid supply nozzle 36 reciprocates along the axial direction of the coating roll 30. In consequence, the coating liquid is uniformly supplied to the whole of the liquid reservoir 38 or 48, so that the coating liquid can be applied uniformly to the surface of the substrate p.

However, after a long period of coating work, a large difference is caused in the viscosity of the coating liquid between the central portion 60 or 64 corresponding to the position of passage of the substrate p and both ends 62 or 66 of the reservoir.

The coating liquid supplied to the central portion 60 or 64 of the reservoir is applied continuously to the surfaces of the successively transported substrates p through the circumferential surface of the coating roll 30. The coating liquid in the central portion 60 or 64 of the liquid reservoir is constantly renewed. The viscosity of the coating liquid in this portion is maintained nearly constant as far as the viscosity of the coating liquid supplied from the coating liquid supply nozzle 36 does not change.

The coating liquid supplied to both end portions 62 or 66 of the liquid reservoir is not applied to the substrate p. Furthermore, if the viscosity of the coating liquid is high, the coating liquid does not move so much. Accordingly, the coating liquid in those end portions is renewed only locally. Particularly in the end portions 62 or 66 of the liquid reservoir, the coating liquid 48 enters the grooves 40 cut in the circumferential surface of the coating roll 30 as shown in FIG. 6. The coating liquid 40 in each groove 40 is hardly renewed. The solvent in the coating liquid 48 evaporates as the time proceeds. As a result, the viscosity of the coating liquid 48 in the end portions 62 or 66 of the liquid reservoir is increased.

A large difference in the viscosity of the coating liquid between the central portion 60 or 66 and the end portions 62 or 66 of the liquid reservoir does not exert significant effects if the width of the substrate p to be processed is constant. However, if the type of the substrate p is changed and the width thereof becomes large, the viscosity of the coating liquid which constitutes a film on the surface of the substrate p changes dependent on the position of the substrate p in the direction perpendicular to the feeding direction of the substrate p. As a result, a film of a uniform thickness cannot be formed.

In order to promote renewal of the coating liquid 68 in the end portions 62 or 66 of the liquid reservoir, it may be considered to use a method of increasing the quantity of the coating liquid supplied from the coating liquid supply nozzle 36 to a quantity more than necessary. Such a method involves, however, disadvantages such as deterioration of the coating liquid or increase of the size of the apparatus and therefore it is not a practical method.

On the other hand, in order to lower the high viscosity of the coating liquid, a method of diluting the coating liquid may be considered.

FIG. 7 shows a relation between a dilution ratio and a viscosity of liquid solder resist at about 25° C. Referring to FIG. 7, the viscosity of this liquid at about 25° C. is lowered from 125 ps to about 100 ps as a result of 1% dilution by using thinner.

However, the viscosity is not determined only by the dilution ratio. An important factor for the viscosity is temperature of the liquid solder resist. As is understood from FIG. 8, the viscosity changes considerably dependent on the temperature of the liquid solder resist. On the other hand, in order to form a film of a desired thickness on a substrate, the viscosity of the liquid solder resist needs to be maintained constantly at a predetermined value. In order to maintained the viscosity constant, it is necessary to control the dilution ratio appropriately for each case in view of the temperature of the liquid solder resist. However, this control is very troublesome.

SUMMARY OF THE INVENTION

Therefore, an object of the present invention is to provide a roll coating apparatus capable of applying a coating liquid having a high viscosity at normal temperature to a surface of a substrate with a uniform thickness.

Another object of the present invention is to provide a roll coating apparatus having a simple structure making it possible to apply a coating liquid having a high viscosity at a normal temperature to a surface of a substrate with a uniform thickness.

An additional object of the present invention is to provide a roll coating apparatus capable of applying a coating liquid having a high viscosity at normal temperature to a surface of a substrate with a prescribed uniform thickness.

A further object of the present invention is to provide a roll coating apparatus capable of applying a coating liquid having a high viscosity at a normal temperature to a surface of a substrate with a prescribed uniform thickness which can be easily controlled.

According to the present invention, the roll coating apparatus includes: a unit for feeding a substrate to the roll coating apparatus; a coating roll rotatably provided which extends over the width of the substrate in a direction intersecting with the substrate feeding direction so as to be in contact with the substrate under pressure; and a doctor device which extends parallel with the axis of the coating roll and contacts it, and defines a space for storing the coating liquid between itself and the coating roll and allows the coating liquid to adhere to the surface of the coating roll according to the rotation thereof. The coating roll and the doctor device have their axial lines inclined by a prescribed angle with respect to the horizontal plane. The roll coating apparatus further includes a coating liquid supply device for supplying the coating liquid to a higher end portion of the space for storing the coating liquid.

The roll coating apparatus is thus constructed. The coating liquid having a high viscosity at a normal temperature is supplied from the coating liquid supply device to the space for storing the liquid. A given quantity of the coating liquid passes through a portion of contact between the doctor device and the coating roll and adheres to the surface of the coating roll. The coating roll and the doctor device are inclined by a prescribed angle with respect to the horizontal plane. Accordingly, the coating liquid adhering to the surface of the coating roll flows downward on the surface of the coating roll due to the weight of itself and rotation of the coating roll. The coating liquid adhering to the surface of the coating roll does not stay at one position. The viscosity of the coating liquid adhering to the surface of the coating roll is maintained uniform over the whole surface of the coating roll. Consequently, when the coating liquid on the surface of the coating roll is transferred to the substrate, the thickness of the film formed by the transfer does not have irregularities dependent on the viscosity.

Thus, it becomes possible to provide a roll coating apparatus capable of applying the coating liquid having a high viscosity at normal temperature to the surface of the substrate with a uniform thickness.

According to the present invention, the coating liquid supply device is provided fixedly at the position of the space for storing the liquid higher than the upper side of the inclined substrate. In order to keep the density of the coating liquid uniform in the space for storing the liquid, the coating liquid supply device does not need to reciprocate over the space for storing the liquid as in the prior art. A device for such movement of the coating liquid supply device is not required either.

Consequently, it becomes possible to provide a roll coating apparatus having a simple structure enabling the coating liquid having the high viscosity at normal temperature to be applied with a uniform thickness to the surface of the substrate.

According to a preferred embodiment of the invention, in order to enable the coating roll to contact the surface of the substrate, the roll coating apparatus further includes: a device for supporting the coating roll adjustably in the vertical direction to permit the coating roll to be in contact with the surface of the substrate, displacing the coating roll and the doctor device adjustably upward and downward, supporting the doctor device in contact with the coating roll, and displacing the doctor device, adjustably toward the coating roll in the substrate feeding direction.

The roll coating apparatus is thus constructed. The force by which the doctor is pressed against the coating roll is adjustable. If the doctor is strongly pressed against the coating roll, the quantity of the coating liquid adhering to the coating roll decreases. As a result, the film formed by the transfer of the coating liquid on the surface of the coating roll to the substrate p becomes thin. In the opposite manner, the film becomes thick. Thus, the thickness of the film can be freely controlled.

Therefore, it becomes possible to provide a roll coating apparatus capable of applying the coating liquid having the high viscosity at normal temperature to the surface of the substrate with a uniform thickness.

According to another aspect of the invention, the roll coating apparatus includes: a device for feeding a substrate to the roll coating apparatus; a coating roll which is provided extending over the width of the substrate in a direction intersecting with the substrate feeding direction, presses the substrate and being rotatable; a doctor device which extends parallel with the axis of the coating roll, to be in contact therewith, defines a space for storing the coating liquid between itself and the coating roll and allows the coating liquid to adhere to the surface of the coating roll according to rotation thereof; and a temperature maintaining device for maintaining the temperature of the coating liquid at a prescribed value or more when the coating liquid adheres to the substrate.

A given quantity of the coating liquid stored in the space for storing the liquid adheres to the surface of the coating roll by means of the doctor device. The coating roll transfers the coating liquid on its surface to the substrate. The temperature maintaining device maintains the temperature of the coating liquid at a prescribed value or more when it is transferred to the substrate.

The viscosity of the coating liquid decreases if the temperature thereof increases. If the viscosity decreases, the thickness of the film formed by the coating liquid can be easily made uniform. There is a definite relation between the viscosity and the temperature of the coating liquid. The temperature of the coating liquid can be easily adjusted. Accordingly, the viscosity of the coating liquid can be also easily adjusted. There is also a definite relation between the viscosity of the liquid and the thickness of the film formed by the transfer of the coating liquid to the substrate. By adjusting the temperature of the coating liquid to be applied to the substrate, it is possible to control the thickness of the film. In this case, since the temperature of the coating liquid is adjusted in an artificial manner, the thickness of the film formed is hardly affected by external factors such as an ambient temperature.

Consequently, it becomes possible to provide a roll coating apparatus capable of applying the coating liquid having the high viscosity at normal temperature to the surface of the substrate with a prescribed uniform thickness which can be easily controlled.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 9:
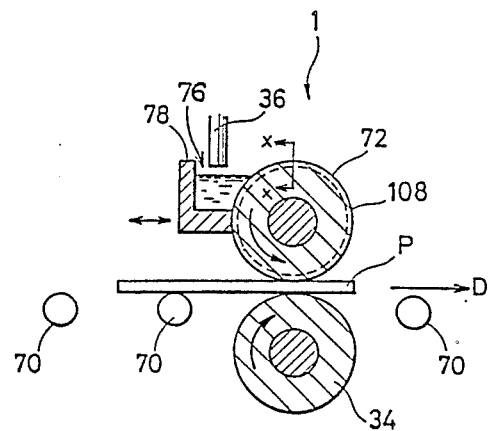
FIG. 9 is a side view of a main part of an embodiment of the present invention.
Figure 10:
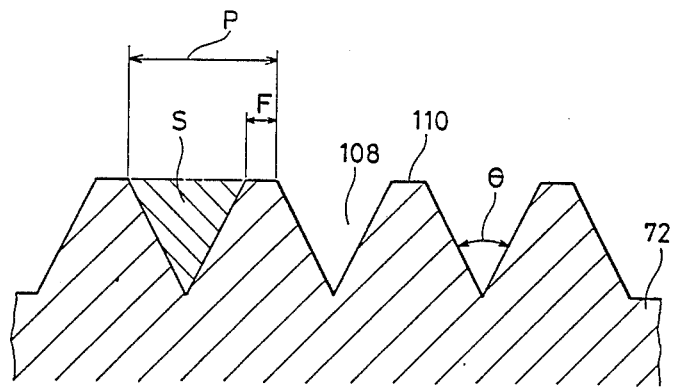
FIG. 10 is an enlarged sectional view of grooves extending along the circular direction on the circumferential surface of a coating roll of the embodiment of the present invention.
Figure 11:
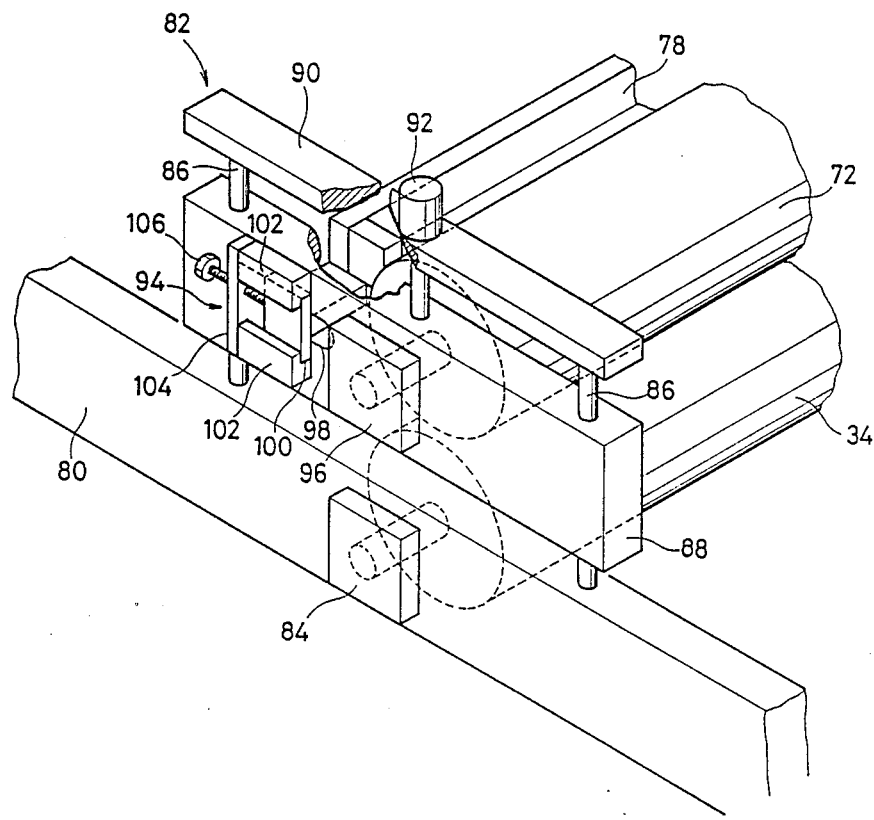
FIG. 11 is a partial fragmental enlarged perspective view of a support device for the coating roll and the like according to the present invention.

FIG. 9 is a schematic side sectional view of a main part of a roll coating apparatus according to a first embodiment of the invention. FIG. 10 is a partial enlarged sectional view taken in the direction of X—X in FIG. 9. FIG. 11 is a main part perspective view of this apparatus.

Referring to FIGS. 9 to 11, the roll coating apparatus 1 comprises: a plurality of feed rollers 70 forming a transport path for feeding a substrate p at a prescribed speed in the direction shown by the arrow D; a coating roll 72 which is provided on the transport path to extend in a direction intersecting with the direction of feeding of the substrate p, and is rotatable in contact with the substrate p under pressure from above; a backup roll 34 which has an axis parallel to that of the coating roll 72 and contacts the coating roll 72 from below; a doctor bar 78 provided on a side of the coating roll 72 to be in contact with the circumferential surface of the coating roll 72 and having a liquid reservoir 76 on its upper surface; and a coating liquid supply nozzle 36 provided above the liquid reservoir 76.

Referring particularly to FIG. 11, the roll coating apparatus further comprises: frames 80 provided on both sides of the transport path; and a coating roll support device 82 for supporting the coating roll 72 and the doctor bar 78 as a unitary body movably in the vertical direction. The frames 80 include bearings 84 for supporting the backup roll 34 rotatably on both ends thereof. The coating roll support device 82 includes: a pair of guide members 86 provided on the frames 80; elevator plates 88 provided slidably along the pair of guide members 86 in the vertical direction; upper frames 90 provided on the pair of the guide members 86; elevation drive means 92 for moving the elevator plates 88 vertically along the guide member 86; and a doctor bar support device 94 provided on a side of each elevator plate 88, for supporting the doctor bar 78 against the circumferential surface of the coating roll 72 with a predetermined pressure.

Each elevator plate 88 includes a bearing 96 for supporting one end of the coating roll 72 rotatably and it has a through hole 98 in which one end of the doctor bar 78 can slide. The doctor bar support device 94 includes: a slider 100 fixed to a portion projecting from the through hole 98, at the related one end of the doctor bar 78; a horizontal guide member 102 for supporting the slider 100 slidably along the feeding direction D of the substrate p; a slider regulator plate 104 fixed to one end of the related horizontal guide member 102, for regulating movement of the slider 100 toward the direction opposite to the direction D, the slider regulator plate 104 having a through hole including an engagement portion; and a bolt 106 to be engaged in the through hole of the slider regulator plate 104 for regulating the pressure of the doctor bar 78 against the coating roll 72. The pressure of the doctor bar 78 against the coating roll 72 can be regulated by rotation of the bolt 106. The bolt 106 can be adapted to rotate by means of a servo motor for example. The elevation drive means 92 includes well known drive means such as a servo motor or an air cylinder. The coating roll 72 can be rotated with a prescribed number of revolutions per minute by means of rotation drive means such as a motor (not shown).

Referring to FIG. 10, a plurality of grooves 108 are formed in the circular direction on the circumferential surface of the coating roll 72. A pitch P of the grooves 108 is 300 μm or more. A summit 110 dividing the respective adjacent grooves 108 has a width F of 80 μm or less.

One or more openings (not shown) provided in prescribed portions of the doctor bar 78 may supply the coating liquid to the liquid reservoir 76 in place of the coating liquid supply nozzle 36.

Operation of the roll coating apparatus thus constructed will be described. The elevation drive means 92 regulates a height of the coating roll 72 in advance. By rotation of the bolt 106, the doctor bar 78 is pressed against the coating roll 72 with a suitable force. The coating roll 72 rotates by a prescribed number of revolutions per minute. In consequence, the coating liquid is supplied between a part of the circumferential surface of the coating roll 72 and the doctor bar 78. When the coating liquid is uniformly supplied to the surface of the coating roll 72, particularly into the respective grooves 108, the substrate p is placed on the feed rolls 70 and it is fed to the coating roll 72 and inserted between the backup roll 34 and the coating roll 72. The coating liquid supplied in the grooves 108 of the coating roll 72 is transferred to the surface of the substrate p. As a result, a nearly even film not causing any inconvenience in practical use can be formed.

First Experimental Example of the First Embodiment:

An experiment for applying a liquid solder resist of a high viscosity of about 20,000 cp to a print circuit board was carried out under the below indicated conditions.

F=20 μm
P=1000 μm
θ=about 50° to 100°
H=50°
τ=0.05 mm
V=3 m/minute
T=20° C.

where H indicates a shore hardness of the coating roll 72; τ indicates a displacement of the doctor bar 78 when it is pressed against the coating roll 72 (referred to hereinafter as displacement by pressing); V indicates a speed in the direction D of feeding of the substrate p; θ indicates an opening angle of each groove 108; and T indicates a liquid temperature of the liquid solder resist. In this experiment, a film of the liquid solder resist having a uniform thickness of 140 μm was formed on the substrate p.

The sectional area S of each group 108 of the coating roll 72 is obtained substantially by the below indicated equation:

$$S=(P-F)^2/4 \tan (\theta/2)$$

The sectional area S of each groove 108 is proportional to square of a width (P−F) of each groove. If the opening angle θ of each groove 108 is constant, the sectional area S becomes small according to increase of the width F of each summit. The larger the pitch P is, the larger the sectional area S of each groove 108 is.

As a result of performing repeatedly coating tests of coating liquid of high viscosity, it is made clear that decrease of the summit F and increase of the pitch P are effective in ensuring uniformity of a coating film. If the opening angle θ of each groove 108 is decreased or the grooves 108 are deepened, it sometimes happens that the coating liquid cannot be completely supplied in the respective grooves 108 because of the high viscosity of the liquid. Accordingly, it should be noted that the opening angle θ of each groove 108 needs to be a prescribed value or more dependent on the viscosity or other factors.

The symbol tau (τ) represents the displacement of doctor bar 78 when force is applied by pressing against the doctor bar when the doctor bar is in line contact with the coating roll.

It is to be noted that if the width F of each summit is more than 80 μm in this experiment, the film formed on the surface of the substrate becomes discontinuous in some parts.

Second Experimental Example of the First Embodiment:

In this experiment, photosensitive polyimide resin having a viscosity of 3,200 cp was applied to a surface of a ceramic substrate The conditions for the application were as follows.

F=20 μm
P=350 μm
θ=about 60° to 110°
H=50°
τ=0.4 mm
V=5 m/minute
T=20° C.

In this experiment, a uniform film of a thickness of about 10 μm was formed on the surface of the substrate.

A similar experiment was carried out by using polyimide resin having a viscosity of 15,000 cp, using the same roll coating apparatus without changing the other conditions. As a result, a film having a uniform thickness of about 20 μm was formed on the surface of the substrate.

In another experiment in which the condition of τ was changed to 0.3 mm, a film formed had a thickness of 40 μm. In an experiment with the condition of τ=0.1 mm, the thickness of the film formed was 50 μm. As a result of those experiments, it is understood that the thickness of a film formed can be adjusted by changing τ. If τ becomes large, part of the doctor bar 78 thrusts into the grooves 108 provided on the circumferential surface of the coating roll 72. As a result, the effective sectional area of each groove 108 decreases. The quantity of the coating liquid filling the grooves 108 decreases. As a result, the quantity of the coating liquid transferred from the coating roll 72 to the substrate p becomes small.

According to the first embodiment, even in the case of using the coating liquid having a high viscosity of more than 1,000 cp, a roll coating apparatus was capable of applying the liquid uniformly and smoothly to the surface of the substrate.

For comparison, an experiment for applying a coating liquid of a low viscosity of less than 1,000 cp to a substrate by using a roll coating apparatus according to this embodiment was carried out. In this experiment, air was mixed in the coating liquid in the grooves 108, causing air bubbles and pin holes were generated in the film on the substrate. As a result, it was found that the film formed cannot have a large thickness.

Figure 12:
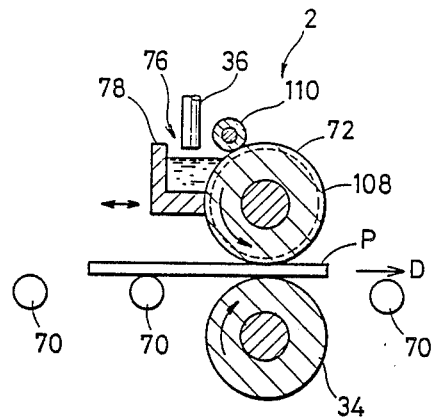
FIG. 12 is a sectional view of a main part of another embodiment of the present invention.

First Variant of the First Embodiment:

FIG. 12 is a side view of a main part of the first variant of a roll coating apparatus according to the first embodiment. This roll coating apparatus further includes a doctor roll 110 in contact with the circumferential surface of the coating roll 72 in addition to the construction of the apparatus of the first embodiment. The doctor roll 110 is preferably provided on the upstream side of the doctor bar 78 with respect to the rotational direction of the coating roll 72. In place of the doctor roll 110, a second doctor bar of the same construction as that of the doctor bar 78 may be provided.

The doctor roll 110 is in contact with the surface of the coating roll 72 with an appropriate pressure. The doctor roll 110 may be rotatable or fixed. A coating liquid supply nozzle may be provided on the doctor roll 110 as required, in the same manner as in the doctor bar 78. In such a case, the coating liquid is also supplied to the surface of the coating roll 72 from the doctor roll 110.

In the roll coating apparatus of the first variant of the first embodiment, the doctor roll 110 is provided on the upstream side of the doctor bar 78 with respect to the rotational direction of the coating roll 72 and it is pressed against the surface of the coating roll 72 with the appropriate pressure. As a result, irregularities of the film thickness of the coating liquid on the surface of the coating roll 72 rapidly disappear and the surface of the coating liquid become smooth.

Figure 13:
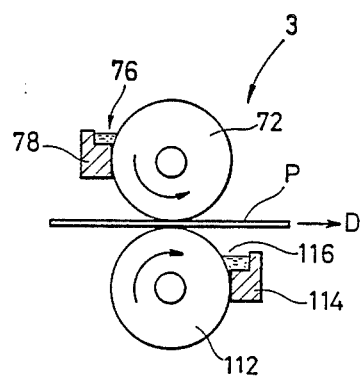
FIG. 13 is a sectional view of a main part of a further embodiment of the present invention.

Second Variant of the First Embodiment:

FIG. 13 is a side sectional view of a main part of a roll coating apparatus 3 of the second variant of the first embodiment of the invention. Referring to FIG. 13, the roll coating apparatus 3 comprises: a coating roll 72 contacting the upper surface of the substrate p from above; a second coating roll 112 contacting the lower surface of the substrate p from below, opposed to the coating roll 72; a doctor bar 78 extending along the axis of the coating role 72 and contacting a lateral surface of the coating roll 72; and a second doctor bar 114 extending along the axis of the second coating roll 112, and contacting a lateral surface of the second contacting roll 112. A coating liquid is supplied through a coating liquid supply nozzle or other means to a liquid reservoir 76 of the doctor bar 78 and a liquid reservoir 116 of the second doctor bar 114.

Referring to FIG. 10, a plurality of grooves 108 are formed in the circular direction on the surface of the coating roll 72 of the roll coating apparatus 3. A pitch P of respective adjacent grooves 108 is 300 $\mu$m or more. A width F of each summit 110 dividing the grooves 108 is 80 $\mu$m. Grooves having the same form are formed also on the circumferential surface of the second coating roll 112.

In this roll coating apparatus, a coating film can be formed simultaneously on each of the upper and lower surfaces of the substrate p. The coating roll 72 and the second coating roll 112 have grooves of the same form as that of the grooves in the first embodiment. Consequently, a uniform film of a high viscosity coating liquid can be formed simultaneously on the upper and back surfaces of the substrate p.

Figure 14:
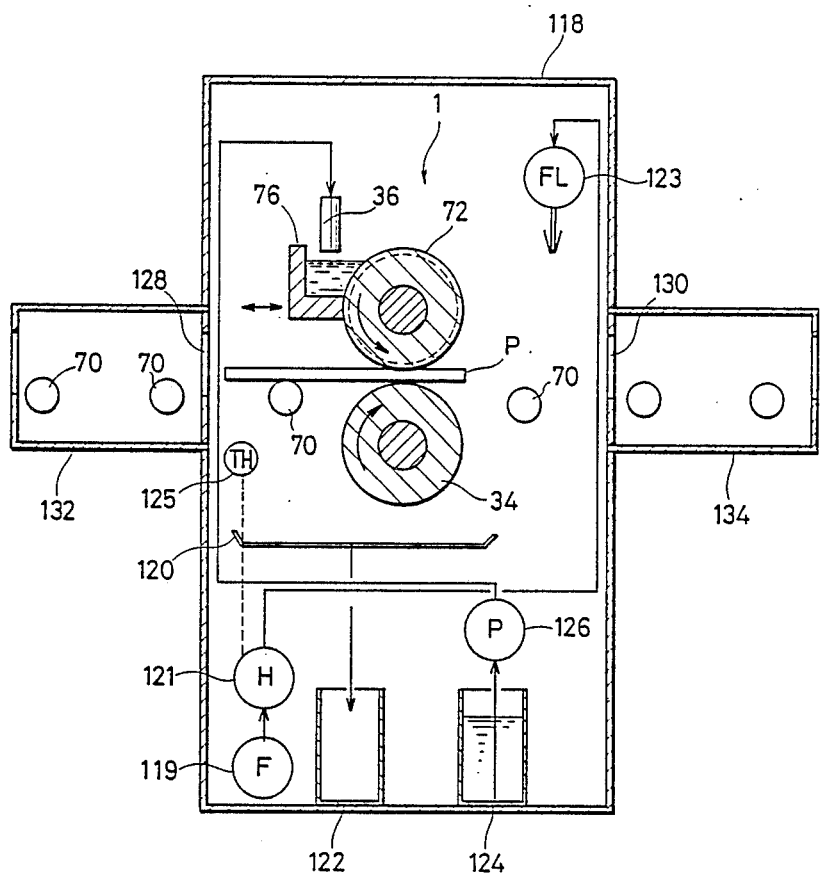
FIG. 14 is a sectional view of an additional embodiment of the present invention.

Third Variant of the First Embodiment:

FIG. 14 is a side sectional view showing a roll coating apparatus according to the third variant of the first embodiment of the invention. Referring to FIG. 14, this roll coating apparatus further comprises a housing 118 which contains the entire body of the roll coating apparatus 1 and adjusts its internal temperature, in addition to the construction of the roll coating apparatus 1 of the first embodiment shown in FIG. 9.

The roll coating apparatus of this variant further comprises: a fan 119 provided within the housing 118, for circulating air in the housing 118; a heater 121 for heating air in the housing 118; a filter 123 for removing dust or the like from the circulating air; a temperature measuring member 125 provided in the housing 118 almost at the same level as the surface of the transport path of the substrate p, for measuring air temperature in the housing 118; and temperature adjusting means (not shown) for adjusting the air temperature in the housing 118 by controlling the heater 121 using a well known mechanism in response to an output of the temperature measuring member 125.

The roll coating apparatus further comprises: a drain butt 120 provided in the housing 118; a waste liquid container 122 connected to the drain butt 120; a coating liquid tank 124 provided in the housing 118, for storing a coating liquid to be supplied to the coating liquid supply nozzle 36; and a pump 126 for feeding the coating liquid from the coating liquid tank 124 to the coating liquid supply nozzle 36.

The housing 118 has an inlet 128 and an outlet 130 for the substrate p and it includes an inlet chamber 132 surrounding the inlet 128 and projecting outside from the housing 118, and an outlet chamber 134 surrounding the outlet 130 and projecting outside from the housing 118. The inlet chamber 132 and the outlet chamber 134 prevent the air in the housing 118 from easily flowing out. The roll coating apparatus placed in the housing 118 is the same apparatus as shown in FIG. 9 and the same portions are denoted by identical characters in those two figures.

Operation of the roll coating apparatus of this variant will be described in the following. Temperature control means (not shown) controls the output of the heater 121 based on the output of the temperature measuring member 125 provided in the housing 118. Air heated by the heater 121 circulates in the housing 118 by means of the fan 119. Dust or the like in the air is removed by the filter 123. The temperature in the housing 118 is maintained at a predetermined temperature, e.g., 30° C. As a result, the temperature of the roll coating apparatus 1 in the housing 118 as well as the temperature of the coating liquid is maintained at 30° C.

The substrate p is transported from outside into the housing 118 through the inlet chamber 132 by means of the feed rollers 70 and it is inserted between the coating roll 72 and the backup roll 34. The coating roll 72 is used to form a film on a surface of the substrate p.

Figure 1:
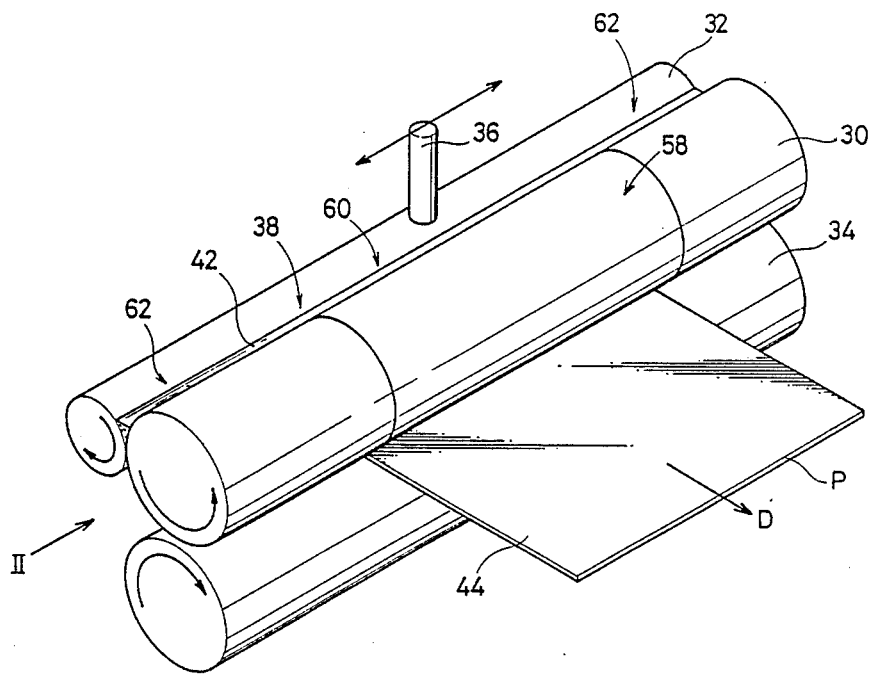
FIG. 1 is a perspective view of a main part of a conventional roll coating apparatus.
Figure 2:
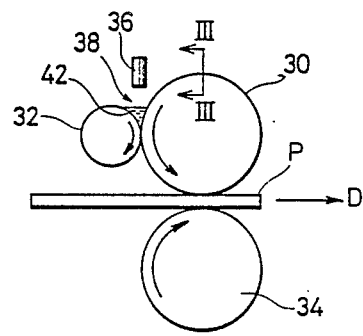
FIG. 2 is a sectional view in the direction of the arrow II in FIG. 1.
Figure 3:
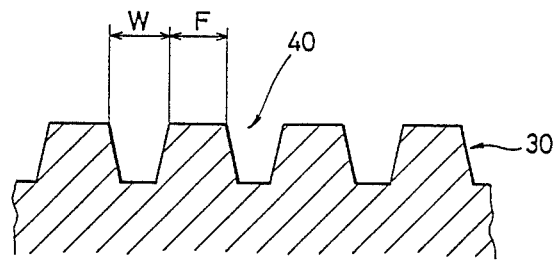
FIG. 3 is a partial enlarged sectional view in the direction of III—III in FIG. 2.
Figure 4:
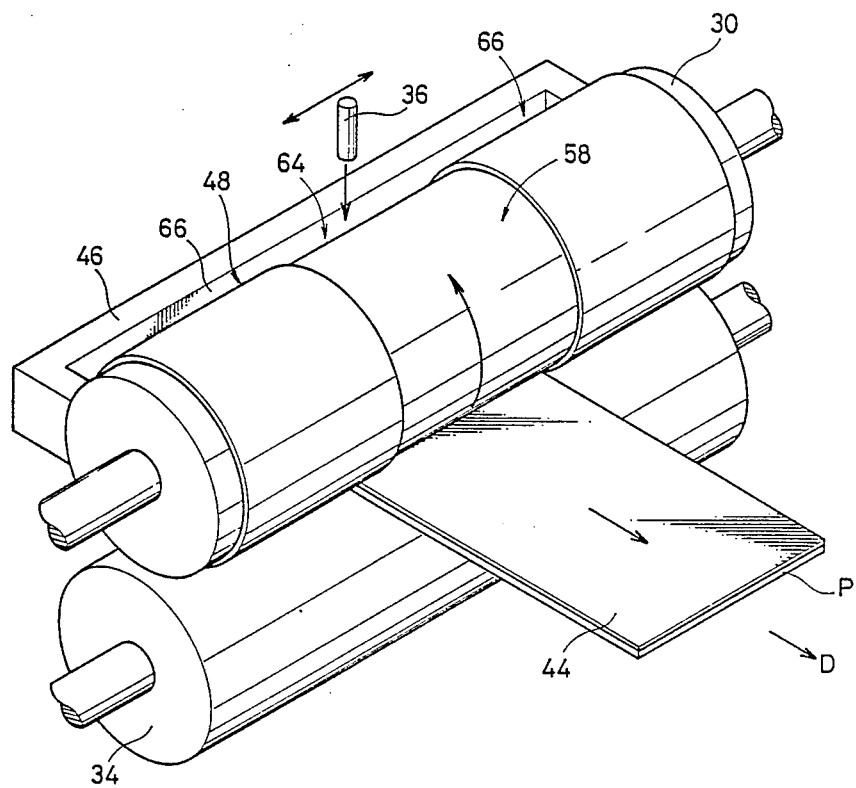
FIG. 4 is a perspective view of a main part of another conventional roll coating apparatus.
Figure 5:
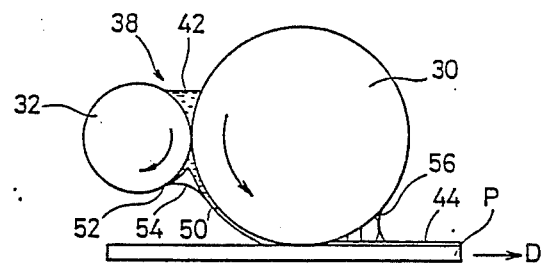
FIG. 5 is a sectional view of a main part of a conventional apparatus during formation of a film.
Figure 6:
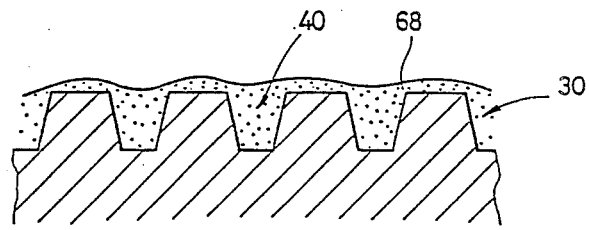
FIG. 6 is an enlarged sectional view of grooves extending along the circular direction on the circumferential surface of a coating roll.
Figure 8:
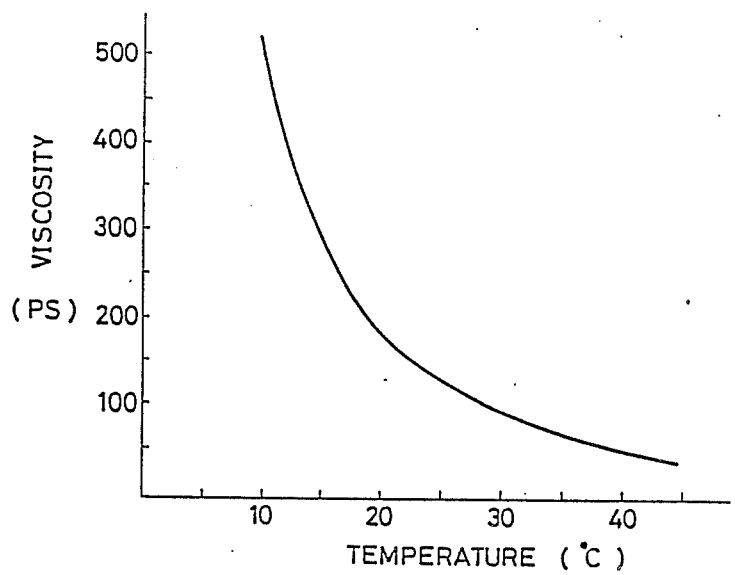
FIG. 8 is a graph showing a relation between a temperature of a coating liquid and its viscosity.

Referring to FIG. 8, when the temperature of the liquid solder resist increases from 20° C. to 30° C., the viscosity thereof is lowered from about 200 ps to about 100 ps. If the temperature is lower than 20° C., thread-like liquid solder resist 56 is often generated between the substrate p and the coating roll 30 as shown in FIG. 5 because of the high viscosity of the liquid solder resist. In the housing 118 where the temperature is maintained at about 30° C. according to this variant, there will be very little threadlike liquid solder resist 56. This is because the viscosity of the liquid solder resist is sufficiently low. Unevenness of the surface or generation of air bubbles does not occur to the coating film on the substrate p. Particularly, the roll coating apparatus according to this variant is effectively utilized in cold regions or in winter.

According to this variant, a plurality of grooves having a cross sectional form as shown in FIG. 10 are formed on the circumferential surface of the coating roll 72. The pitch P of grooves is 300 $\mu$m or more. The summit width F is 80 $\mu$m or less. However, the form of the grooves is not limited to the above described one or even no groove is necessary, because the viscosity of the coating liquid is maintained lower than that at the normal temperature by the temperature maintaining effect of the heater 121 and the housing 118. Needless to say, if a coating roll 72 having grooves is used, the same effect can be obtained even if the temperature in the housing 118 is set lower than that in the case of using a coating roll not having grooves.

Figure 15:
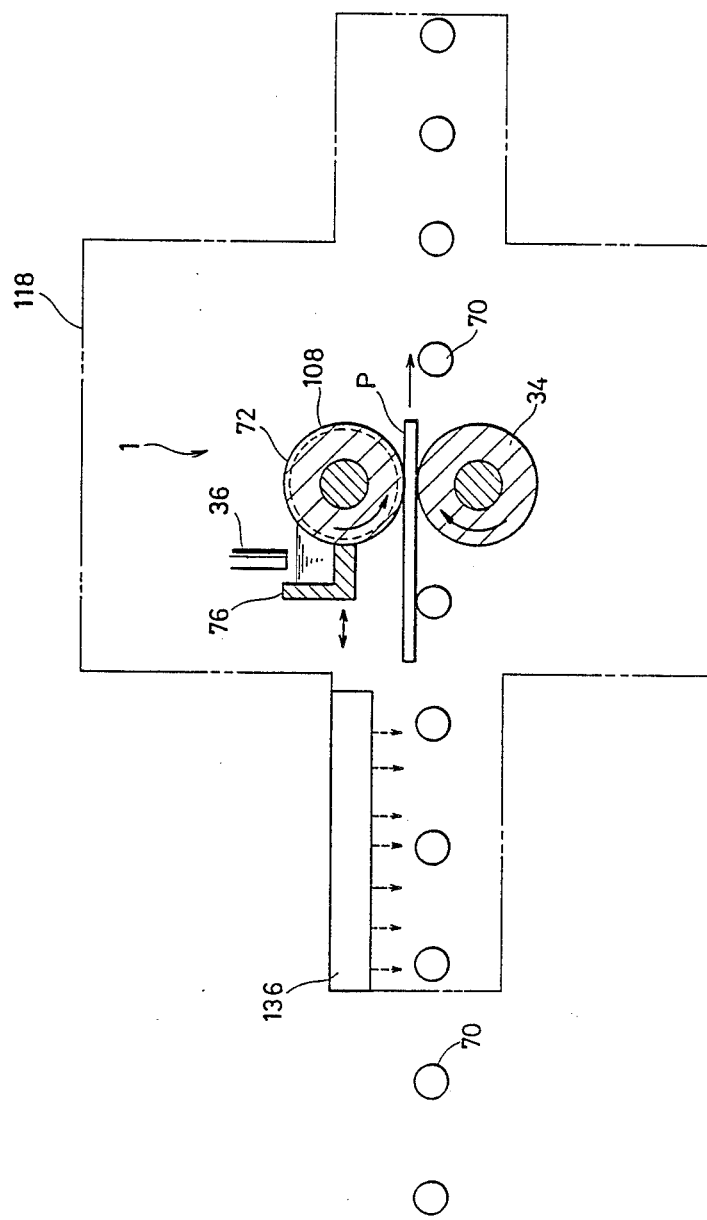
FIG. 15 is a sectional view schematically showing a construction of a further embodiment of the present invention.

Fourth Variant of the First Embodiment:

FIG. 15 is a side view showing an outline construction of a roll coating apparatus according to the fourth variant of the first embodiment. Referring to FIG. 15, the roll coating apparatus comprises: the roll coating apparatus 1 of the first embodiment; a plurality of feed rollers 70 for feeding a substrate p to the roll coating apparatus 1; and heating unit 136 provided over the feed rollers 70 on the upstream side of the roll coating apparatus 1, and may further comprises a housing 118 which contains the roll coating apparatus 1.

The heating unit 136 heats the upper surface of the substrate p to be fed to the roll coating apparatus 1. The viscosity of the viscous liquid solder resist or the like applied to the substrate p by means of the coating roll 72 is lowered on the surface of the substrate p. Consequently, the surface of the coating film formed on the substrate p becomes smooth.

Figure 15A:
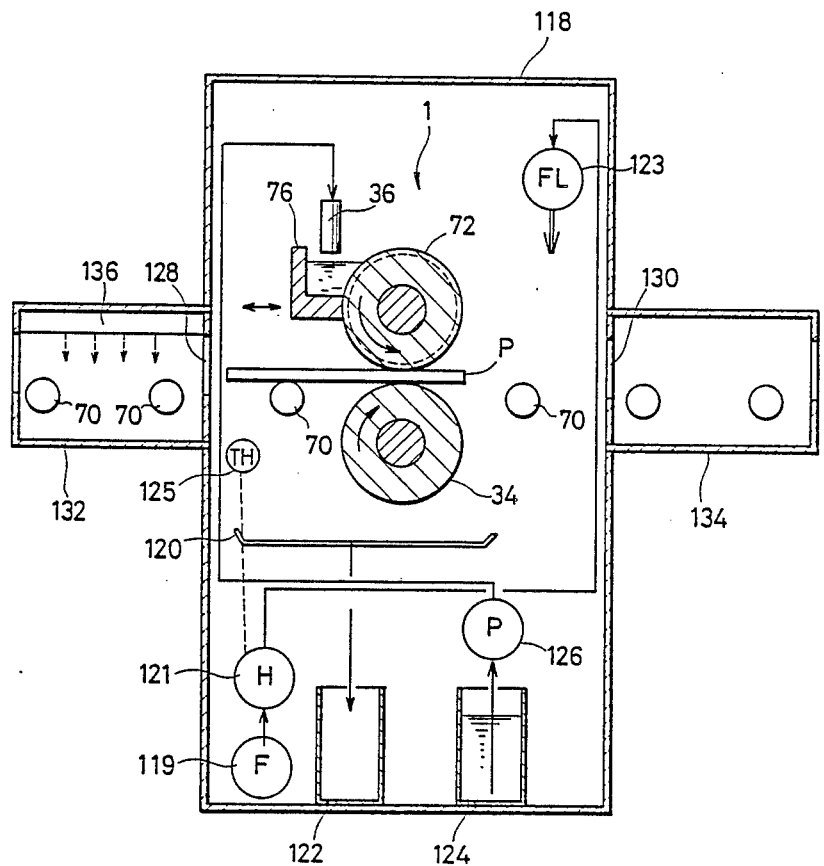
FIG. 15A is a sectional view showing a specified example of the apparatus shown in FIG. 15.

FIG. 15A is a side view showing a further specified example of a roll coating apparatus according to this variant. Referring to FIG. 15A, this roll coating apparatus comprises, in addition to the roll coating apparatus of the third variant of the first embodiment shown in FIG. 14, heating unit 136 provided in an upper portion of the inlet chamber 132, for heating the upper surface of the substrate p transported toward the coating roll 72 from above. It is to be noted that the other respective elements and their reference characters shown in FIG. 15A are the same as the corresponding elements and their reference characters shown in FIG. 14. In order to avoid repetition of the description, a detailed description of the construction and operation of those elements is omitted.

In the roll coating apparatus shown in FIG. 15A, the temperature of the substrate p is raised to a predetermined value, e.g., 50° C. by the heating unit 136 before it is fed to the coating roll 72. The temperature in the housing 118 is maintained at 30° C. by the heater 121 and the fan 119. As a result, the temperatures of the coating roll 72, the backup roll 34, the coating liquid and so on are all maintained at about 30° C.

In the roll coating apparatus of this variant, the temperature in the housing 118 is controlled so as to maintain the viscosity of the coating liquid at a preferred value and, in addition, the substrate p is also heated. The viscosity of the coating liquid applied to the substrate p is appropriately maintained at a low value and a high hydrophilic property is held between the surface of the substrate p and the coating liquid. Accordingly, the coating film on the surface of the substrate p is formed with a uniform thickness and an equal density.

An electric heater, an infrared ray lamp or the like is used as the heating unit 136. A hot air generating means may be employed as the heating unit 136 which emits a stream of hot air against the surface of the substrate to raise its temperature. In another case, the heating unit 136 may include a heated plate laid under the substrate transport path, and a conveyor belt sliding on the heated plate. the substrate is heated by the heated plate while it is transported by the conveyor belt on the heated plate. In still another case, a walking beam carrier can be used for transporting and heating the substrate. In this case, the heated substrate is fed to the roll coating apparatus by the walking beam carrier after being placed on the heated plate for a prescribed period of time.

In this variant as well, grooves or no groove may be provided on the surface of the coating roll 72. The effect of the grooves, when provided, is the same as in the above described variants.

Figure 16:
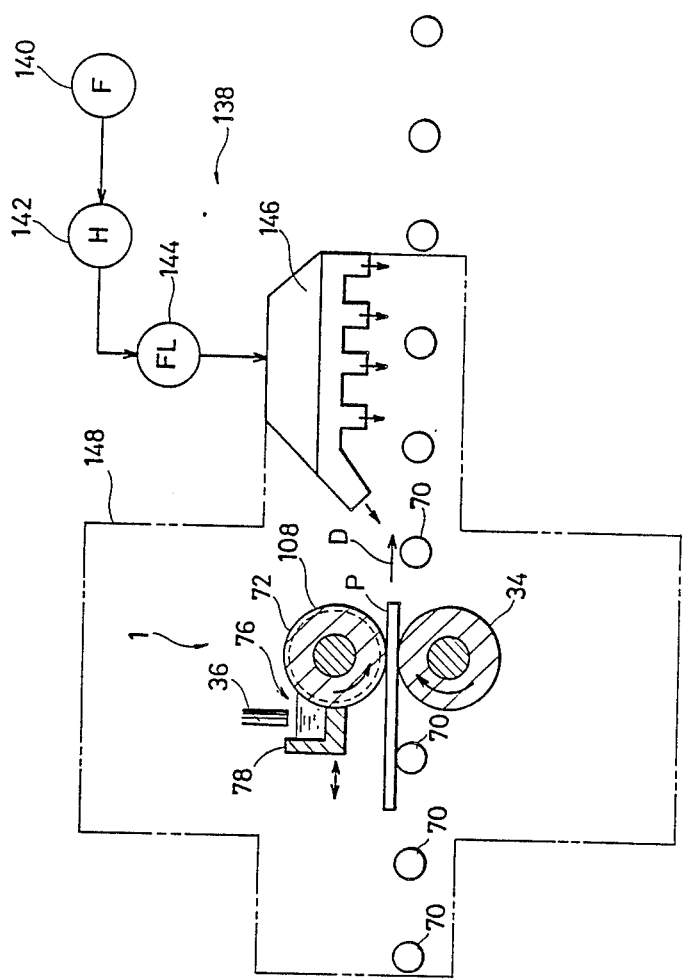
FIG. 16 is a sectional view showing an outline construction of a further embodiment of the present invention.

Fifth Variant of the First Embodiment:

FIG. 16 is a side view showing an outline construction of a roll coating apparatus of the fifth variant of the first embodiment of the invention. Referring to FIG. 16, the roll coating apparatus comprises: the roll coating apparatus 1 of the first embodiment; and heating unit 138 provided on the transport path on the side of sending out the substrate p from the roll coating apparatus 1, for heating the surface of the substrate p. The heating unit 138 comprises for example a fan 140, a heater 142 for heating the air sent by the fan 140, a filter 144 for removing dust or the like from the air sent from the heater 142, and an air nozzle set 146 for sending the heated air onto the surface of the substrate p.

The roll coating apparatus 1 is the same as the apparatus shown in FIG. 9, described in connection with the first embodiment. The respective elements of the roll coating apparatus 1 shown in FIG. 16 are denoted by the identical reference characters as those shown in FIG. 9.

Referring to FIG. 16, operation of this roll coating apparatus will be described. The substrate p is transported on the feed rolls 70 in the direction shown by the arrow D. A layer of a coating liquid is formed beforehand on the circumferential surface of the coating roll 72 by means of the doctor bar 78. While the substrate p is passing on the feed rolls 70 and the backup roll 34, a sufficiently uniform film causing hardly any inconvenience in practical use is formed on the upper surface of the substrate p. When the substrate p is further transported by means of the feed rolls 70, it is heated by hot air sent from the air nozzle 146.

The coating liquid which constitutes the film on the substrate p is also heated. The viscosity of the coating liquid is lowered as the temperature becomes high, as shown in FIG. 8. Consequently, the viscosity of the surface of the film heated on the substrate p is lowered and the leveling of the surface is further promoted.

If the air nozzle set 146 is disposed to permit part of the heated air to blow toward the position of contact between the coating roll 72 and the substrate p, generation of such threadlike coating liquid 56 as shown in FIG. 5 is suppressed. This is because the viscosity of the coating liquid at the position of contact between the coating roll 72 and the substrate p is further lowered.

The roll coating apparatus may further include a housing 148 for covering the entire construction and maintaining the internal temperature. This housing 148 may have the same structure as the housing 118 in the apparatus shown in FIG. 15A.

The heating unit 138 may be various means other than that shown in FIG. 16. For example, heating unit of an irradiation type using infrared rays may be used.

Figure 7:
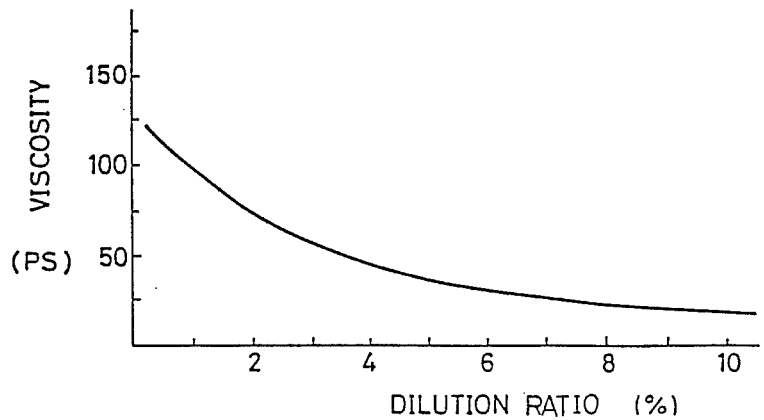
FIG. 7 is a graph showing a relation between a dilution ratio of a coating liquid and its viscosity.
Figure 17:
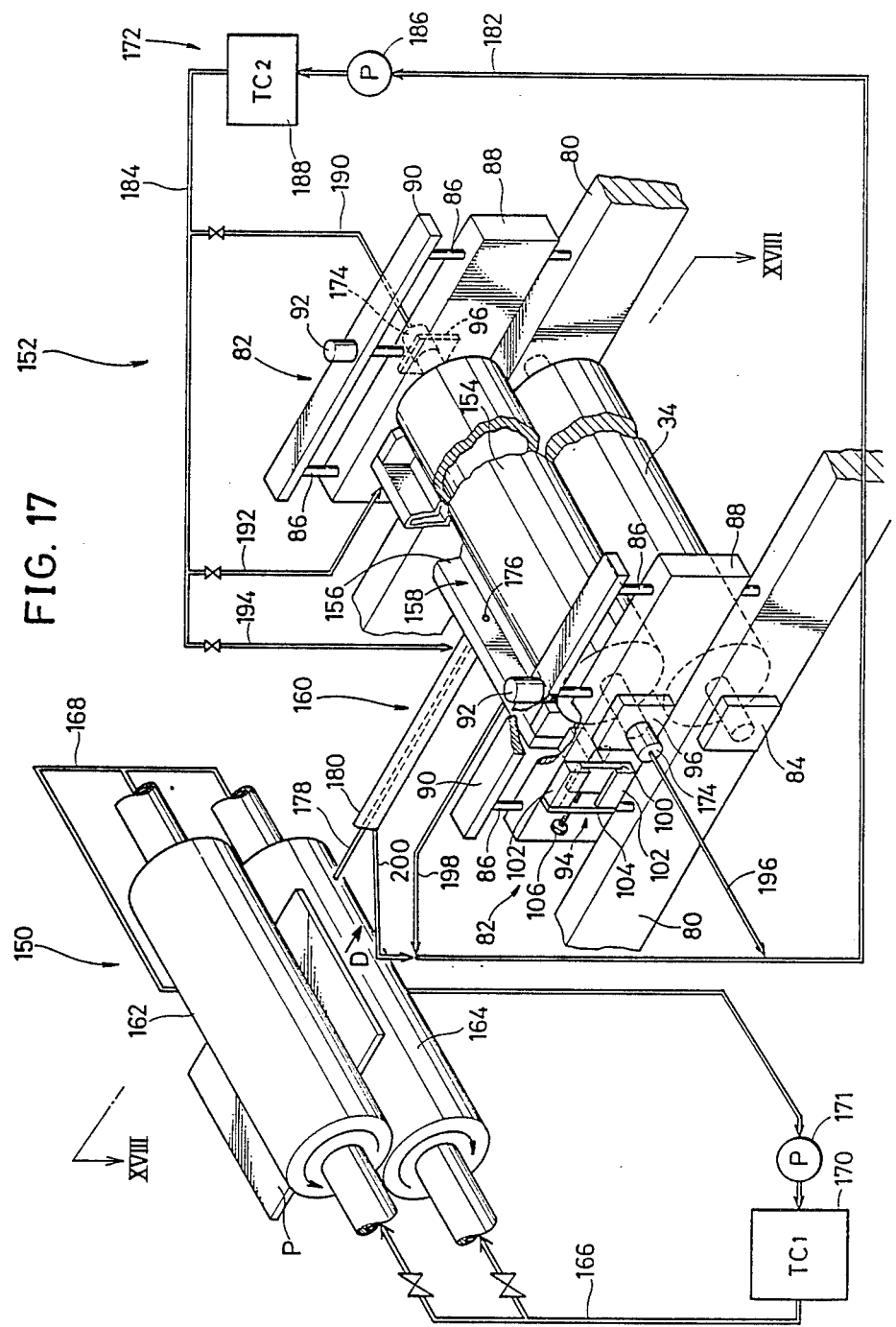
FIG. 17 is a partial fragmental perspective view showing an additional embodiment of the present invention.
Figure 18:
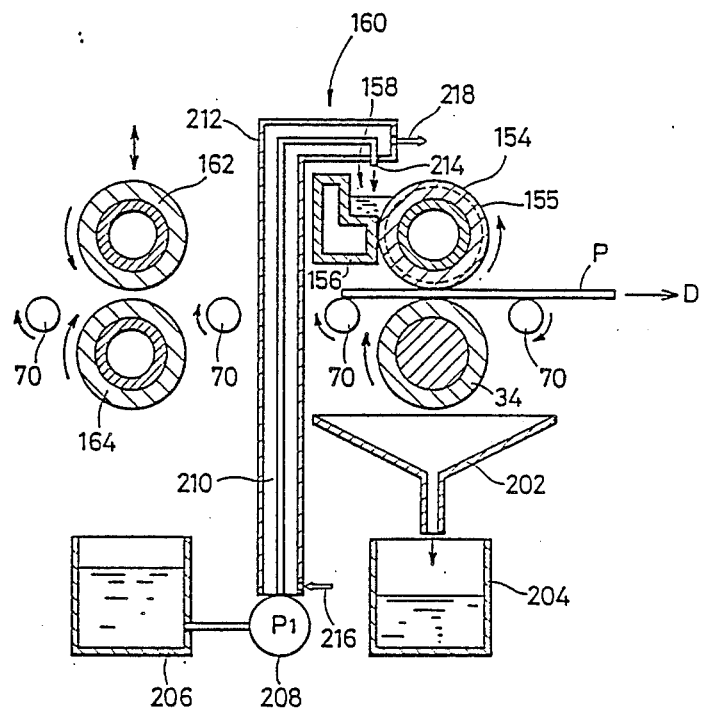
FIG. 18 is a sectional view taken in the direction of XVIII—XVIII in FIG. 17.

Second Embodiment:

FIG. 17 is a perspective view of a main part of a roll coating apparatus according to the second embodiment of the invention. FIG. 18 is a sectional view corresponding to the sectional view taken in the direction of XVIII—XVIII in FIG. 17. It is to be noted that in the apparatus shown in FIG. 18, a doctor bar 156 and means for supplying the coating liquid to the doctor bar 156 are different from the doctor bar 156 and the means 160 for supplying the liquid to the doctor bar 156 shown in FIG. 17. FIG. 18 further indicates several components not shown in FIG. 7 for convenience of explanation.

Referring to FIG. 17, the roll coating apparatus comprises a substrate heating unit 150 for transporting the substrate p in the direction shown by the arrow D and heating the substrate p, and a roll coating unit 152 for forming a film of the coating liquid on the substrate p.

The substrate heating unit 150 comprises: a pair of hollow heating rollers 162 and 164 for holding the substrate p therebetween and transporting the same; pipes 166 and 168 connected to the hollow portions of the heating rollers 162 and 164 by means of rotary joints not shown; heating unit 170 connected to the pipes 166 and 168 for heating a heat medium in the pipes 166 and 168; and a pump 171 connected to the pipes 166 and 168 for circulating the heat medium in the pipes 166 and 168.

The heating rollers 162 and 164 have their respective ends supported rotatably by frames not shown. The heating roller 162 is supported movably by a prescribed distance in the vertical direction.

The roll coating unit 152 comprises: a hollow coating roll 154 extending in a direction intersecting with the direction of feeding of the substrate p, pressing the substrate p from above and being rotatable; a backup roll 34 having an axis parallel to that of the coating roll 154 and contacting the coating roll 154 from below; a hollow doctor bar 156 extending along the axis of the coating roll 154, located on a side of the coating roll 154, to be in contact with the circumferential surface thereof and having a liquid reservoir 158 in its upper portion; frames provided on both sides of the transport path of the substrate p; a coating roll support device 82 for supporting the coating roll 154 and the doctor bar 158 as a unitary body movably in the vertical direction; coating liquid supply means 160 for supplying the coating liquid to the liquid reservoir 158; and heat medium circulating means 172 for circulating the heat medium in the roll coating unit 152. A plurality of grooves 155 are provided in the circular direction on the circumferential surface of the coating roll 154. The sectional form of each groove 155 is the same as that of each groove 108 shown in FIG. 10.

The coating roll support device 82 is the same as described in connection with the first embodiment with reference to FIG. 11. In FIG. 17, the same parts as those in FIG. 11 are denoted by the identical reference characters. It is to be noted that the coating roll support device 82 shown in FIG. 17 further includes rotary joints 174 provided in bearings 96 for connecting the hollow portion of the coating roll 154 and the heat medium circulating means 172, in addition to the coating roll support device 82 shown in FIG. 11.

The doctor bar 156 has an opening 176 at the center of the liquid reservoir 158, for supplying the coating liquid.

The coating liquid supply means 160 comprises a pipe 178 penetrating the doctor bar 156 and connected to the liquid reservoir 158 through the opening 176, and a jacket 180 covering the pipe 178, for heating the coating liquid in the pipe 178 by circulation of the heat medium therein.

The heat medium circulating means 172 comprises pipes 182 and 184 where the heat medium circulates, a pump 186 connected to the pipes 182 and 184 for circulating the heat medium in the pipes, and heating unit 188 connected to the pipes 182 and 184, for heating the heat medium. The pipe 184 is connected to the hollow portion of the coating roll 154 through a pipe 190, to the hollow portion of the doctor bar 156 through a pipe 192, and to the inner portion of the jacket 180 through a pipe 194. The pipe 182 is connected to the hollow portion of the coating roll 154 through a pipe 196, to the hollow portion of the doctor bar 156 through a pipe 198, and to the inner portion of the jacket 180 through a pipe 200.

FIG. 18 is a sectional view corresponding to the sectional view taken along the direction of XVIII—XVIII in FIG. 17. It should be noted that the construction of the coating liquid supply means 160 is different from that shown in FIG. 17. Referring to FIG. 18, this apparatus further comprises: feed rolls 70 for feeding the substrate p in the direction of the arrow D; a drain butt 202 provided under the backup roll 34, for collecting waste liquid caused by the coating; a waste liquid tank 204 provided under the drain butt 202, for storing the collected waste liquid; a coating liquid tank 206 for storing in advance the coating liquid to be supplied to the liquid reservoir 158 through the coating liquid supply means 160; and a pump 208 for sending the coating liquid in the coating liquid tank 206 to the coating liquid supply means 160.

The coating liquid supply means 160, which is different from the example shown in FIG. 17, comprises a reverse L-shaped pipe 210 connected to the pump 208 and extending over the liquid reservoir 158, and a jacket 212 surrounding the pipe 210. A portion of the pipe 210 located over the liquid reservoir 158 constitutes a coating liquid supply nozzle 214. A pipe 216 is provided in a lower portion of the jacket 212. A pipe 218 is provided in an upper portion of the jacket 212.

The heating unit 170 and 188 comprise temperature control means TC1 and TC2, respectively, for controlling the temperature of the heat medium by using a well-known technique.

In the following, operation of the roll coating apparatus shown in FIG. 17 or FIG. 18 will be described. The pumps 171 and 186 circulate the heat medium in the pipes. The heat medium is heated to a prescribed temperature, e.g., 30° C. or more by the heating unit 170 and 188. The heated heat medium enters the hollow portions of the heating rolls 162 and 164 through the pipe 166. The heat medium passes through the heating rolls 162 and 164 and then it reaches &he pump 171 through the pipe 168.

Part of the heat medium sent out from the pump 186 and heated to 30° C. or more by the heating unit 188 passes through the pipe 190 and enters the hollow portion of the coating roll 154. The heat medium coming out from the coating roll 154 enters the pipe 182 through the pipe 196. Part of the heat medium in the pipe 184 enters the hollow portion of the doctor bar 156 through the pipe 192. The heat medium coming out from the doctor bar 156 enters the pipe 182 through the pipe 198.

The other part of the heat medium in the pipe 184 enters the jackets 180 and 212 through the pipes 196 and 216, respectively. The heat medium moving in the jackets 180 and 212 passes through the pipes 200 and 218 and enters the pipe 182. The heat medium collected in the pipe 182 passes through the pump 186 and the heating unit 188, so that it is heated again and sent into the pipe 184.

The heat medium circulates as described above. The heating rolls 162 and 164, the coating roll 154 and the doctor bar 156 are maintained at the prescribed temperature. The coating liquid receives a quantity of heat from the heat medium while it moves in the pipes 178 and 210. The viscosity of the coating liquid becomes low at a high temperature as described previously with reference to FIG. 8. Accordingly, the viscosity of the coating liquid in the liquid reservoir 158 is maintained at a preferred value.

When the coating roll 154 rotates at a prescribed speed, a layer of the coating liquid is formed on the circumferential surface of the coating roll 154. The coating liquid of this layer is also maintained at a preferred temperature, so that a uniform film is formed on the surface of the coating roll 154. When the uniform film is formed on the surface of the coating roll 154, the substrate p is placed on the feed rolls 70 and fed to the coating roll 154. The substrate p is inserted first between the heating rolls 162 and 164, whereby the surface temperature of the substrate p is raised to 30° C. or more.

The heated substrate p is then inserted between the backup roll 34 and the coating roll 154. The coating liquid having the temperature adjusted at about 30° C. is transferred to the surface of the substrate p by means of the coating roll 154 and the like. By the above described process, a film of a sufficiently uniform thickness causing hardly any inconvenience in practical use can be formed continually on the surfaces of the substrates p successively fed. Particularly, since the substrate p is heated, the viscosity of the coating liquid thereon is lowered and in addition the hydrophilic property of the substrate p with respect to the coating liquid is enhanced. Accordingly, the coating liquid adheres easily to the substrate p and leveling of the surface is promoted.

In the above described embodiment, the substrate p is inserted between the heating rolls 162 and 164 and both surfaces of the substrate p are heated. However, by using only the heating roll 162, only the surface on which the coating is formed may be heated to a prescribed temperature. The heating rolls 162 and 164 may be heated by an electric heater and a temperature measuring member incorporated therein.

The pipe 178 in FIG. 17 may be provided within the doctor bar 156. In this case, the jacket 180 is not required. The coating liquid in the pipe 178 is heated by the heat medium in the doctor bar 156.

The heat medium is for example oil or hot water. The heating of the doctor bar 156 can be effected by using an electric heater and a temperature measuring member provided in its bottom surface, in place of using the heat medium. The doctor bar 156 may be replaced by a general-purpose doctor roll.

The backup roll 34 may be replaced by a second coating roll. In this case, the coating liquid can be applied to both surfaces of the substrate p simultaneously by using this device. The respective surfaces of the heating rolls 162 and 164, the coating roll 154 and the backup roll 34 are normally made of rubber. However, they may be made of resin.

The grooves 155 having the same sectional form as the grooves 108 in FIG. 10 are provided on the circumferential surface of the coating roll 154. However, if the temperature of the coating liquid is maintained suitably, the viscosity of the liquid is sufficiently low and it is not necessary to impose limitations to the pitch of the grooves 155 or the summit width as defined in the first embodiment. Depending on the viscosity of the coating liquid, the substrate heating unit 150 may be emitted.

Figure 19:
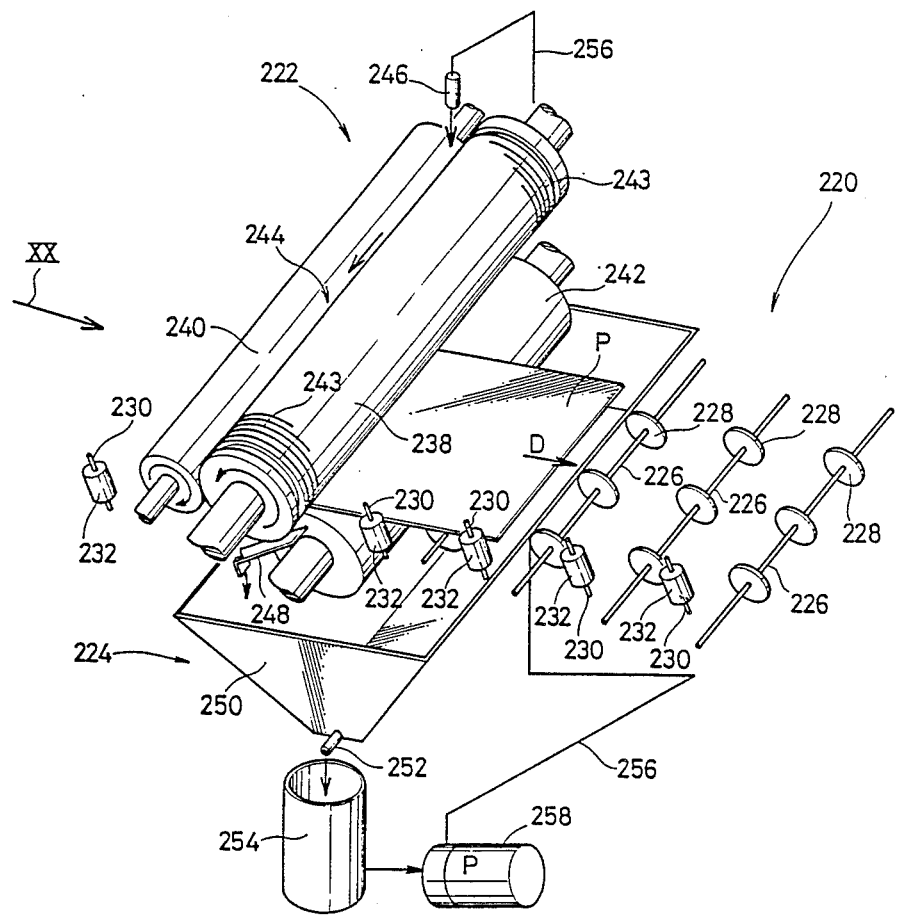
FIG. 19 is a perspective view of a main part of a further additional embodiment of the present invention.
Figure 20:
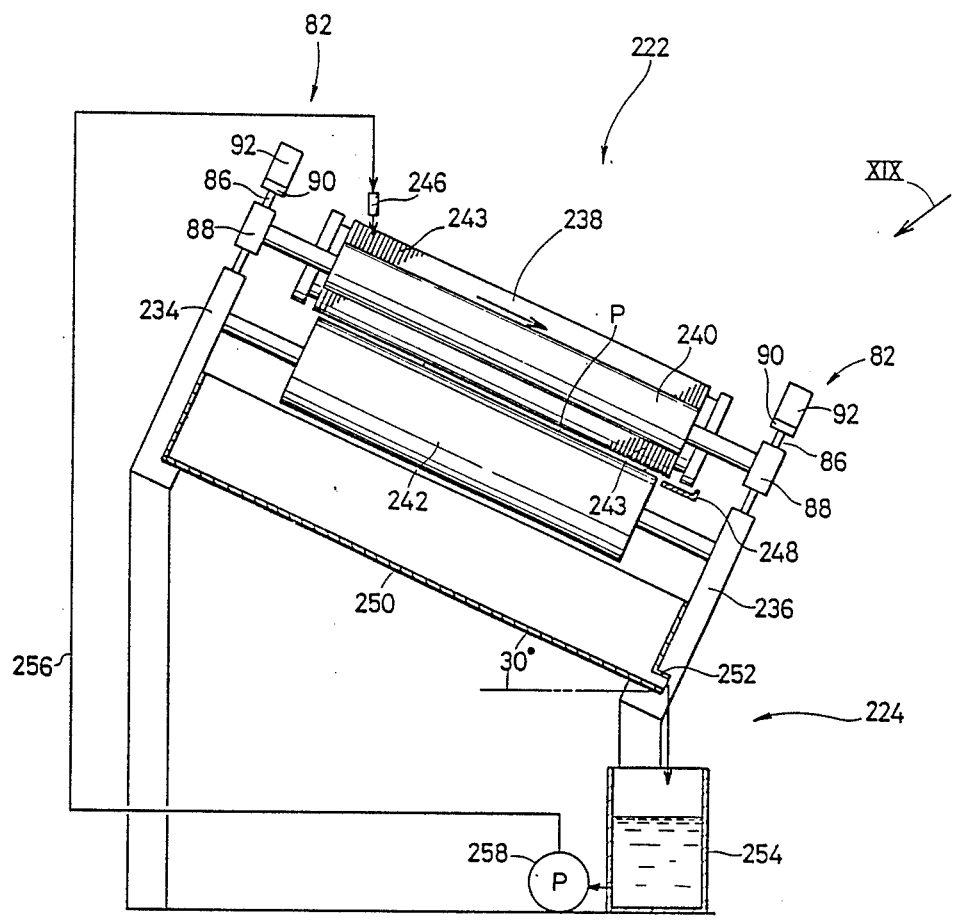
FIG. 20 is a view taken in the direction of the arrow XX in FIG. 19.

Third Embodiment:

FIG. 19 is a perspective view of a roll coating apparatus according to the third embodiment of the invention. FIG. 20 is a view of the main part thereof taken from the side shown by the arrow XX in FIG. 19. FIG. 19 corresponds to a perspective view taken from the side of XIX in FIG. 20.

Referring to FIGS. 19 and 20, the roll coating apparatus according to this embodiment comprises a transport unit 220 for transporting the substrate p in the direction shown by the arrow D, a roll coating unit 222 for forming a film of the coating liquid on the surface of the substrate p, and a coating liquid circulating unit 224 for receiving and reutilizing the coating liquid not adhering to the substrate p.

The transport unit 220 comprises: a plurality of rotating shafts 226 intersecting with the direction D of transport of the substrate p and inclined by about 30° with respect to the horizontal plane; feed rolls 228 of the same diameter provided on the respective rotating shafts 226; a plurality of rotating shafts 230 perpendicular to the respective rotating shafts 226; and guide rolls 232 each provided on one of the respective rotating shafts 230 and rotating about the related rotating shafts 230. The upper ends of the respective feed rolls 228 are on the same plane and defined an area where the substrate p is transported, namely, the area of the transport path.

The roll coating unit 222 comprises: a coating roll 238 having its axial line intersecting with the direction D of transport of the substrate p and parallel to the transport plane, that is, inclined by 30° with respect to the horizontal plane; a doctor roll 240 having its axial line parallel to that of the coating roll 238 and to be adjustably in contact with the coating roll 238; frames 234 and 236 provided on both sides of the transport path; a backup roll 242 with its both ends rotatably supported by the frames 234 and 236 and contacting the coating roll 238 from below; and a pair of coating roll support units 82 for supporting the coating roll 238 and the doctor roll 240 as a unitary body movably in the direction perpendicular to the transport plane of the substrate p and rotatably.

Each of the rotating shafts 226 of the feed rolls 228 has its two ends rotatably attached to the frames 234 and 236, whereas each of the rotating shafts 230 of the guide rolls 232 has its two ends rotatably attached to the frame 236 only. Grooves 243 in the circular direction are provided at predetermined pitches on the circumferential surface of the coating roll 238. A liquid reservoir 244 for storing the coating liquid is formed on the line of contact between the coating roll 238 and the doctor roll 240. The liquid reservoir 244 is also inclined by about 30° with respect to the horizontal plane.

The coating liquid circulating unit 224 comprises: a coating liquid supply nozzle 246 located over the highest portion of the liquid reservoir 244, for supplying the coating liquid of a high viscosity, e.g., 1,000 cp or more to the liquid reservoir 244; a gutter 248 provided under the lowest end of the coating roll 238, for receiving the coating liquid falling from the coating roll 238 and allowing the liquid to flow downward; a drain butt 250 located under the backup roll 242, supported at both ends by the frames 234 and 236 with its axis parallel with that of the backup roll 242, and receiving the coating liquid falling from the coating roll 238, the doctor roll 240 and the backup roll 242, with an opening 252 for discharging the coating liquid being provided at the lowest end of the drain butt 250; a coating liquid tank 254 provided under the opening 252, for storing the coating liquid; a pipe 256 connecting the coating liquid tank 254 and the coating liquid supply nozzle 246; and a pump 258 connected to the pipe 256, for moving the coating liquid from the coating liquid tank 254 to the supply nozzle 246.

Figure 21:
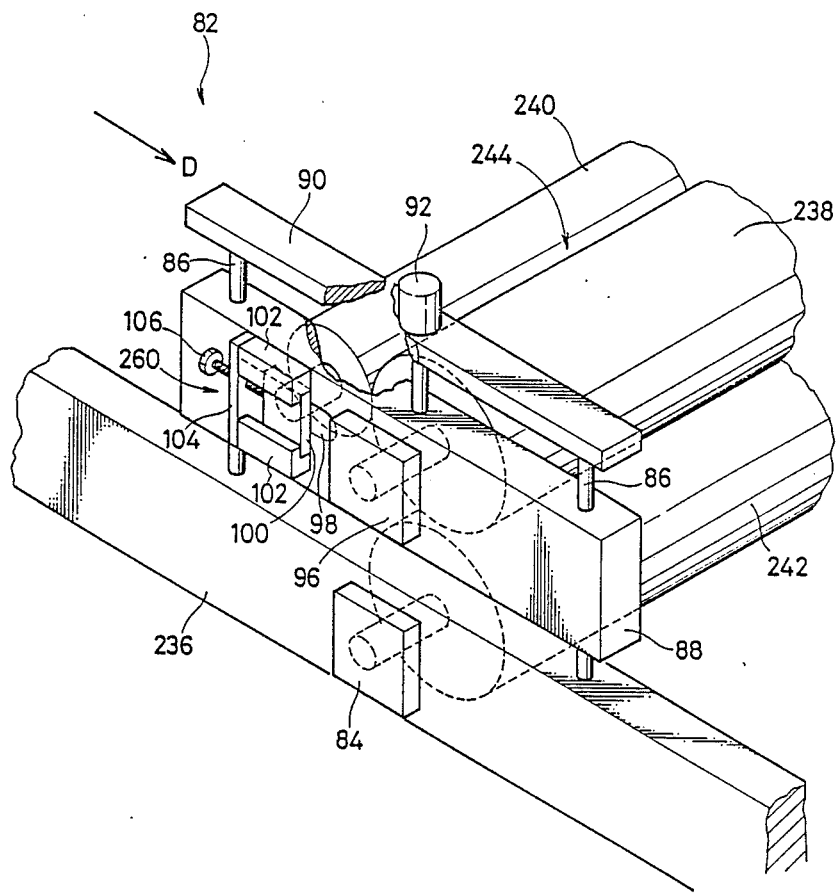
FIG. 21 is a partial fragmental enlarged perspective view of a support device for the coating roll and the like of the apparatus shown in FIG. 20.

FIG. 21 is an enlarged perspective view, with portions broken away for clarification, of one of the coating roll supporting units 82. The frame 236 includes a bearing 84 for supporting the backup roll 242 rotatably around its axis. The coating roll support unit 82 comprises: a pair of guide members 86 provided on the frame 236 (or 234); an elevator plate 88 vertically slidable along the pair of guide members 86; an upper frame 90 provided on the pair of guide members 86; elevation drive means 92 provided on the upper frame 90, for moving the elevator plate 88 vertically along the guide members 86; and a doctor roll support device 260 provided on a side surface of the elevator plate 88, for supporting the doctor roll 240 by pressing the same against the circumferential surface of the coating roll 238 with a prescribed force. The elevator plate 88 includes a bearing 96 for supporting one end of the coating roll 238 rotatably and it has a through hole 98 in which the one end of the doctor bar 240 slides. The doctor roll support device 260 comprises: a slider 100 fixed to the one end of the doctor roll 240 projecting from the through hole 98; a horizontal guide member 102 for slidably supporting the slider 100 along the direction D of transport of the substrate p; a slider regulator plate 104 fixed to one end of the horizontal guide member 102, for regulating movement of the slider 100 toward the direction opposite to the direction of the arrow D, a through hole having an engagement portion being provided in the slider regulator plate 104; and a bolt 106 engaged with the through hole of the slider regulator plate 104, for regulating the pressing force of the doctor roll 240 against the coating roll 238.

The force of pressing the doctor roll 240 can be regulated by rotating the bolt 106 by manual operation. It can be also regulated by rotating the bolt 106 by using a servo motor for example. The elevation drive means 92 comprises a well-known drive source such as a servo motor or an air cylinder. The coating roll 238 is coupled to rotation drive means (not shown) such as a motor and it is rotated by a prescribed rotating speed.

Operation of the roll coating apparatus of the third embodiment will be described. The coating roll 238 is set to a suitable level according to the thickness of the substrate p by the elevation drive means 92. The coating roll 238 is rotated with a prescribed rotating speed. The pump 258 sends the coating liquid in the coating liquid tank 254 to the coating liquid supply nozzle 246. The coating liquid supply nozzle 246 supplies the coating liquid to the highest end of the liquid reservoir 244.

The liquid reservoir 244 is inclined. The coating liquid supplied to the upper end of the liquid reservoir 244 falls toward the lower end of the liquid reservoir 244 by the weight of itself and the rotation of the grooves 243 provided on the circumferential surface of the coating roll 238. While the coating liquid flows successively from the upper end of the liquid reservoir 244 to the lower end thereof, the coating liquid in the liquid reservoir 244 is constantly renewed. Thus, the viscosity of the coating liquid in the liquid reservoir 244 becomes uniform throughout the entire length of the reservoir 244.

After the coating liquid is uniformly supplied to the surface of the coating roll 238, particularly into the grooves 243 in the surface, the substrate p is placed on the feed rolls 228 and transported. Since the transport path is inclined by 30° with respect to the horizontal plane, the substrate p might slip down from the transport path in the direction perpendicular to the transport direction D. The guide rolls 232 are provided to prevent the substrate p from falling down.

The substrate p transported to the coating roll 238 is inserted between the backup roll 242 and the coating roll 238. The coating liquid supplied in the grooves 243 of the coating roll 238 is transferred onto the surface of the substrate p. By the above described operation, an almost uniform film causing hardly any inconvenience in practical use is formed on the substrate p.

An excess of the coating liquid returns to the coating liquid tank 254 from the circumferential surface of the coating roll 238 through the gutter 248, the drain butt 250 and the opening 252. The coating liquid passes through the pipe 256 by means of the pump 258 and it is refed to the coating liquid supply nozzle 246 and thus used in a circulating manner.

In this third embodiment, the doctor roll 240 is used as the doctor means. However, the present invention is not limited to this embodiment. For example, a doctor bar as used in the first embodiment (i.e., the doctor bar 78 in FIG. 9) may be used. In such a case, an opening for supplying the coating liquid may be provided in the highest portion of the liquid reservoir of the doctor bar, in place of the coating liquid supply nozzle 246.

In the same manner as in the apparatus shown in FIG. 12, a doctor bar and a doctor roll may be provided so as to be in contact with the coating roll 238. In such a case, if the doctor roll is provided upstream of the doctor bar with respect to the rotational direction of the roll 238 and in contact with the coating roll 238 with an appropriate pressure, a film formed on the substrate will have a uniform thickness even if the coating liquid has a high viscosity.

In the same manner as in the apparatus shown in FIG. 13, a second coating roll 112 may be provided in place of the backup roll 242. The doctor to be in contact with the second coating roll 112 may be a doctor bar or a doctor roll. Such combination makes it possible to form a uniform film on both surfaces of the substrate p simultaneously.

The angle of inclination of the coating roll 238, the doctor roll 240 (or the doctor bar) and the backup roll 242 is preferably in the range from 10° to 80°. However, the angle of inclination is not particularly limited to this range and this angle can be set according to the viscosity of the coating liquid, the conditions of the grooves 243 on the circumferential surface of the coating roll, or the like. The grooves 243 on the circumferential surface of the coating roll 238 are not necessarily required. The grooves 243 are more preferably provided in a direction enabling the coating liquid in the grooves to easily fall down, so that the coating liquid in the grooves may be renewed easily.

The roll coating unit according to the third embodiment may be provided in the housing 118 as indicated in the third variant of the first embodiment. If the temperature in the housing 118 is maintained suitably, the viscosity of the coating liquid is maintained at a preferred level and the film formed on the substrate has a more uniform thickness.

As shown in the second embodiment, means for heating the coating roll 238 and/or a doctor may be provided. In such a case, the coating liquid flowing through the coating liquid supply nozzle 246 is heated and maintained at a prescribed temperature by means of the coating roll 238 and/or a doctor.

Figure 22:
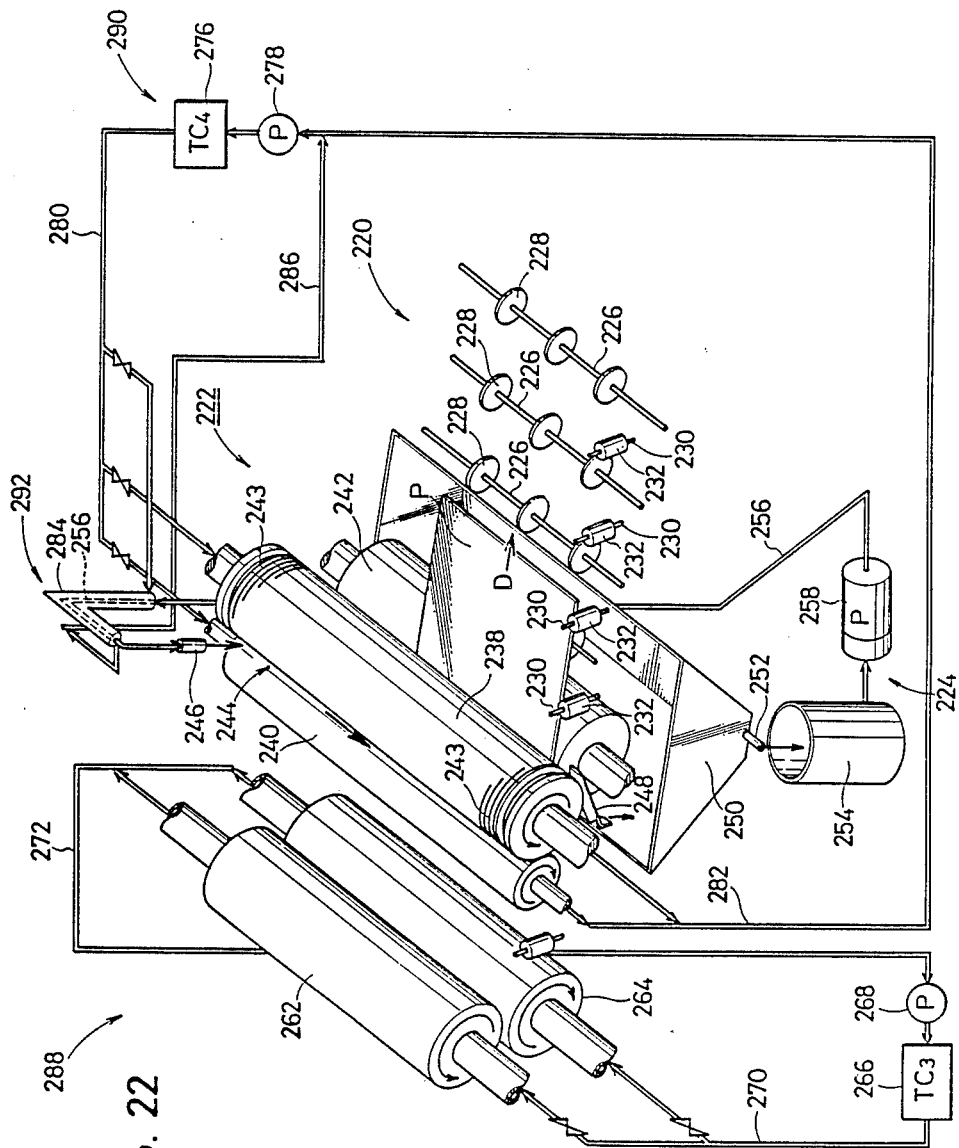
FIG. 22 is a perspective view of a main part of a further embodiment of the present invention.

FIG. 22 is a perspective view showing a roll coating apparatus of a more preferred first variant of the third embodiment. This apparatus comprises, in addition to the roll coating apparatus shown in FIG. 19, a substrate heating device 288, a roll coating unit heating device 290 for heating the coating roll 238, the doctor roll 240 and the like, and coating liquid heating unit 292 for heating the coating liquid supply means 256 to raise the temperature of the coating liquid. In FIG. 22, the portions identical or corresponding to the portions of the apparatus shown in FIG. 19 are denoted by the identical reference characters. The apparatus of FIG. 22 is different from the apparatus of FIG. 19 in that the coating roll 238 and the doctor roll 240 are both hollow.

The substrate heating device 288 comprises: a pair of hollow heating rolls 262 and 264 parallel to each other, located on upper and lower sides of the plane on which the substrate p is transported; a pipe 270 connected to one end of each of the heating rolls 262 and 264 by means of a rotary joint or the like; a pipe 272 connected to the other end of each of the heating rolls 262 and 264 by means of a rotary joint or the like; a pump 268 connected to the pipes 270 and 272 for circulating a heat medium in the pipes 270 and 272 and the hollow portions of the pair of hollow heating rolls 262 and 264; and heating unit 266 connected to the pipe 270 and the pump 268 for heating the heat medium. The heating rolls 262 and 264 are supported detachably from each other and rotatably around their respective axes by means of frames not shown. The heating unit 266 includes temperature control means TC3 for maintaining the heat medium at a prescribed temperature by using a well-known technique.

The roll coating unit heating device 290 comprises: a pipe 280 connected to the respective hollow portions of the doctor roll 240 and the coating roll 238 at their respective one ends by means of rotary joints not shown; a pipe 282 connected to the respective hollow portions of the doctor roll 240 and the coating roll 238 at their respective other ends by means of rotary joints not shown; a pump 278 connected to the pipes 280 and 282 for circulating the heat medium in the pipes 280 and 282 and the hollow portions of the coating roll 238 and the doctor roll 240; and heating unit 276 for heating the heat medium. The heating unit 276 includes temperature control means TC4 for adjusting the temperature of the heat medium by using a well-known technique.

The coating liquid heating unit 292 includes a hollow jacket 284 covering part of the pipe 256. One end of the jacket 284 is connected to the pipe 280. The other end of the jacket 284 is connected to the pump 278 through the pipe 286.

Operation of the roll coating unit 222 is the same as that of the roll coating unit 222 in the third embodiment described with reference to FIGS. 19 to 21. In the following, operations of the roll coating unit heating device 290, the coating liquid heating unit 292 and the substrate heating device 288 will be described.

The pump 278 sends out the heat medium toward the heating unit 276 by applying a pressure to the heat medium. The heating unit 276 maintains the temperature of the heat medium at a prescribed value, e.g., 30° C. The heated heat medium flows into the coating roll 238, the doctor roll 240 and the jacket 284 from the pipe 280.

The coating roll 238 and the doctor roll 240 are maintained at a prescribed temperature by heat exchange with the heat medium passing therethrough.

The heat medium in the jacket 284 heats the pipe 256. The coating liquid flowing in the pipe 256 exchanges heat with the heat medium through the wall of the pipe 256, so that it is maintained at a prescribed temperature. The coating liquid the temperature of which is regulated is supplied to the higher ends of the coating roll 238 and the doctor roll 240 through the coating liquid supply nozzle 246.

The temperature of the coating liquid is regulated as described above and the temperature of the coating roll 238 and that of the doctor roll 240 are maintained at a prescribed value. The coating liquid supplied to the coating roll 238 flows downward along the surface of the coating roll 238 due to its weight and rotations of the coating roll 238 and the doctor roll 240. The viscosity of the coating liquid is maintained low while it flows on the surface of the coating roll 238. The doctor roll 240 keeps constant the temperature of the coating liquid on the surface of the coating roll 238. Consequently, the coating liquid is spread uniformly on the circumferential surface of the coating roll 238. Since the coating liquid flows constantly on the circumferential surface of the coating roll 238, it does not stay on any area of the surface and no difference is caused in its density.

The pump 268 and the heating unit 266 in the substrate heating device 288 circulate the heat medium regulated at the prescribed temperature through the hollow portions of the pair of heating rolls 262 and 264. The pair of heating rolls 262 and 264 hold the substrate p therebetween and transport the substrate p toward the roll coating unit 222 while they are rotating.

The respective surfaces of the heating rolls 262 and 264 are maintained at the prescribed temperature. The substrate is heated while it is passing between the heating rolls 262 and 264. The temperature of the surface of the substrate p is heated for example to 50° C.

The heated substrate p is supplied to the roll coating unit 222. Since the substrate has the high temperature, the surface has a high hydrophilic property. The coating liquid is spread uniformly on the surface of the coating roll 238 and the viscosity thereof is low. In consequence, the film formed on the substrate p has a smooth surface and a uniform thickness.

According to the third embodiment and its variant, there is no difference in the viscosity of the coating liquid between the central portion and the two end portions of the liquid reservoir. The viscosity of the coating liquid is maintained even in the whole area of the liquid reservoir. This effect is maintained even if the coating film is formed successively on substrates for a long period by using a coating liquid of a high viscosity. Consequently, the roll coating apparatus is capable of forming a film having a uniform thickness over the whole surface of each substrate even if a large number of substrates having different widths are processed.

In the roll coating apparatus according to this embodiment, the coating liquid supply means is fixed to the higher end of the liquid reservoir. Thus, there is an advantage that the structure of the apparatus is simple since a moving mechanism for the coating liquid supply means is not required.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A roll coating apparatus for applying a coating liquid having a high viscosity at a normal temperature to a surface of a substrate fed thereto, comprising:
   means for feeding said substrate to said roll coating apparatus,
   a coating roll extending along a width of said substrate in a direction intersecting with a direction of feeding of said substrate, so as to be in contact with said substrate under pressure, said coating roll being rotatable, and
   doctor means extending parallel with an axis of said coating roll, so as to be in contact with said coating roll, defining a space for storing said coating liquid between said coating roll and said doctor means, and allowing said coating liquid to adhere to a surface of said coating roll according to rotation thereof, said coating roll and said doctor means having their respective axial lines inclined with a prescribed angle with respect to a horizontal plane, and coating liquid supply means for supplying said coating liquid to said space for storing said coating liquid at a position higher than the upper side of the substrate.

2. A roll coating apparatus in accordance with claim 1, further comprising
means for supporting said coating roll adjustably upward or downward to permit said coating roll to be in contact with the surface of said substrate, displacing said coating roll and said doctor means adjustably upward or downward, supporting said doctor means in contact with said coating roll, and displacing said doctor means adjustably toward said coating roll along said substrate feeding direction.

3. A roll coating apparatus in accordance with claim 2, further comprising
temperature maintaining means for maintaining a temperature of said coating liquid adhering to said substrate at a prescribed value or more.

4. A roll coating apparatus in accordance with claim 3, wherein
said temperature maintaining means comprises means for heating the surface of said coating roll to a prescribed temperature.

5. A roll coating apparatus in accordance with claim 4, wherein
said coating roll has a hollow portion along its axis, and
said means for heating the surface of said coating roll to the prescribed temperature comprises
pipe means connected to both ends of the hollow portion of said coating roll,
a heat medium circulating in said pipe means and said hollow portion of said coating roll and exchanging heat with said coating roll,
heating unit connected to said pipe means, for heating said heat medium to a predetermined temperature, and
circulating means connected to said pipe means, for circulating said heat medium.

6. A roll coating apparatus in accordance with claim 3, wherein
said temperature maintaining means comprises means for heating a surface of said doctor means to a prescribed temperature.

7. A roll coating apparatus in accordance with claim 6, wherein
said doctor means has a hollow portion extending at least over the width of said substrate,
said means for heating the surface of said doctor means to the prescribed temperature comprises
pipe means connected to both ends of the hollow portion of said doctor means,
a heat medium circulating in said pipe means and said hollow portion of said doctor means and exchanging heat with said doctor means,
heating unit connected to said pipe means, for heating said heat medium to a predetermined temperature, and
circulating means connected to said pipe means, for circulating said heat medium.

8. A roll coating apparatus in accordance with claim 2, further comprising means for heating said substrate fed thereto.

9. A roll coating apparatus in accordance with claim 8, wherein
said means for heating said substrate comprises means located over said substrate feeding means, for sending heated air to said substrate.

10. A roll coating apparatus in accordance with claim 9, wherein
said means for sending the heated air to said substrate further comprises
means located on a downstream side of said coating roll along said substrate feeding direction, for sending hot air to a position of contact between said coating roll and said substrate.

11. A roll coating apparatus in accordance with claim 8, wherein
said means for heating said substrate comprises
a pair of rollers located on an upstream side of said coating roll along said substrate feeding direction, contacting an upper surface and a lower surface of said substrate respectively and being rotatable, and
roller heating unit for heating at least either roller of said pair of rollers.

12. A roll coating apparatus in accordance with claim 11, wherein
at least either roller of said pair of rollers has a hollow portion extending at least along the width of said substrate,
said roller heating unit comprises
pipe means connected to both ends of said roller having the hollow portion and communicating with said hollow portion,
a heat medium circulating in said pipe means and said hollow portion of said roller, to effect heat exchange with said roller,
heating unit connected to said pipe means, for heating said heat medium to a prescribed temperature, and
circulating means connected to said pipe means, for circulating said heat medium.

13. A roll coating apparatus in accordance with claim 3, wherein
said temperature maintaining means comprises housing means for housing said coating roll and said doctor means.

14. A roll coating apparatus in accordance with claim 13, wherein
said temperature maintaining means further comprises heating unit provided in said housing means, for heating air in said housing means, thereby maintaining a temperature in said housing means at prescribed value.

15. A roll coating apparatus in accordance with claim 3, wherein
said temperature maintaining means comprises heating unit for heating said coating liquid supply means to a prescribed temperature.

16. A roll coating apparatus in accordance with claim 15, wherein
said coating liquid supply means comprises
a coating liquid tank for storing said coating liquid, pipe means connected to said coating liquid tank, for guiding said coating liquid to the space for storing said coating liquid, and nozzle means connected to said pipe means for discharging said coating liquid to a highest end portion of the space for storing said coating liquid.

17. A roll coating apparatus in accordance with claim 16, wherein said means for heating said coating liquid supply means to the prescribed temperature comprises covering means for covering said pipe means, and means for supplying the heat medium at the prescribed temperature into said covering means.

18. A roll coating apparatus in accordance with claim 16, wherein means for heating said coating liquid supply means to the prescribed temperature further comprises
heating unit connected to said pipe means, for heating said heat medium, and
circulating means connected to said pipe means, for circulating said heat medium.

19. A roll coating apparatus in accordance with claim 2, wherein said doctor means includes a doctor bar extending along the axis of said coating roll and contacting said coating roll, said doctor bar being not rotated by rotation of said coating roll.

20. A roll coating apparatus in accordance with claim 19, wherein said coating roll has a circumferential surface on which grooves of a pitch of 300 μm or more extending along the circular direction of said roll are formed at intervals of 80 μm or less.

21. A roll coating apparatus in accordance with claim 20, further comprising:

second doctor means extending along the axis of said coating roll and located on the upstream side of said doctor bar in the rotating direction of said roll and pressing the surface of said coating roll while being in contact with said coating roll.

22. A roll coating apparatus in accordance with claim 20, further comprising a second coating roll contacting said coating roll from below, holding said substrate between said coating roll and said second coating roll and being rotatable, and second coating liquid adhesion allowing means extending along an axis of said second coating roll, for defining a space for storing said coating liquid between said means and said second coating roll and allowing said coating liquid to adhere to said second coating roll.

23. A roll coating apparatus for applying a coating liquid of a high viscosity of more than 1000 cp to the surface of a plate substrate being fed to the apparatus, said apparatus comprising:

means for feeding said substrate to said roll coating apparatus;

a rotatable coating roll extending in a first direction intersecting a direction of feeding of the substrate and effective for pressing against the substrate;

doctor means extending parallel to an axis of said coating roll and defining a space between said coating roll and said doctor means for storing said coating liquid in a manner allowing said coating liquid to adhere to a surface of said coating roll upon rotation of said coating roll;

temperature maintaining means for maintaining the temperature of the coating liquid adhering to the substrate above a predetermined value;

coating liquid supply means for supplying the coating liquid to said space; and said coating roll having a circumferential surface and a plurality of axially spaced and circumferentially extending grooves on said surface, said grooves having a pitch of at lest 300 μm and an axial spacing between grooves which is not greater than 80 μm.

24. The roll coating apparatus of claim 23, wherein said temperature maintaining means comprises surface heating means for heating the surface of said coating roll to a prescribed temperature, said coating roll having a hollow interior extending along said axis.

25. The roll coating apparatus of claim 24, wherein said surface heating means comprises:

pipe means connected to ends of said hollow interior of said coating roll;

a heating medium circulating through said pipe means and said hollow interior of said coating roll;

a heating unit for heating said heating medium to a predetermined temperature; and circulating means coupled to said pipe means for circulating said heating medium through said pipe means.

26. The roll coating apparatus of claim 25, further comprising:

supply heating means for heating said coating liquid supply means to said prescribed temperature, said supply heating means comprising covering means for covering said pipe means, and means for supplying the heating medium at the prescribed temperature into said covering means.

27. The roll coating apparatus of claim 26, wherein said supply heating means comprises a respective heating unit connected to said pipe means for heating said heating medium.

28. The roll coating apparatus of claim 23, further comprising substrate heating means, said substrate heating means comprising:

a pair of rotatable rollers located on an upstream side of said coating roll relative to said substrate feeding direction, said pair of rollers effective for contacting an upper surface and a lower surface of said substrate, a roller heating unit for heating at least one roller of said pair of rollers.

29. The roll coating apparatus of claim 28, wherein:

at least one roller of said pair of rollers has a respective hollow interior extending substantially along the entirety of a width dimension associated with said substrate;

said roller heating unit comprising:

a further pipe means connected to opposite ends of said roller having said hollow interior for communicating with the hollow interior thereof;

a respective heating medium for circulating through said further pipe means and through said hollow interior of said roller;

a further heating unit connected to said further pipe means for heating said heating medium to the prescribed temperature; and a further circulating means connected to said further pipe means for circulating said heating medium.

30. A roll coating apparatus of claim 23, further comprising substrate heating means for heating said substrate, said substrate heating means comprising means located above said substrate feeding means for supplying heated air to the substrate.

31. The roll coating apparatus of claim 23, wherein said doctor means is in contact with said coating roll and further including:
a second rotatable coating roll disposed generally below and contacting said coating roll and effective for holding said substrate between said coating roll and said second coating roll; and
second doctor means extending generally parallel to an axis of said second coating roll and effective for defining a space between said second doctor means and said second coating roll for storing said coating liquid in said space in a manner allowing said coating liquid to adhere to said second coating roll.

32. The roll coating apparatus of claim 23, wherein said temperature maintaining means comprises surface heating means for heating the surface of said doctor means to a prescribed temperature, and said doctor means has a hollow interior extending along an axis thereof.

33. The roll coating apparatus of claim 32, wherein said surface heating means comprises:
pipe means connected to ends of said hollow interior of said doctor means;
a heating medium circulating through said pipe means and said hollow interior of said doctor means;
a heating unit for heating said heating medium to a predetermined temperature; and
circulating means coupled to said pipe means for circulating said heating medium through said pipe means.

34. The roll coating apparatus of claim 33, further comprising:
supply heating means for heating said coating liquid supply means to said prescribed temperature, said supply heating means comprising covering means for covering said pipe means, and means for supplying the heating medium at the prescribed temperature into said covering means.

35. The roll coating apparatus of claim 34, wherein said supply heating means comprises a respective heating unit connected to said pipe means for heating said heating medium.

36. The roll coating apparatus of claim 32, further comprising substrate heating means, said substrate heating means comprising:
a pair of rotatable rollers located on an upstream side of said coating roll relative to said substrate feeding direction, said pair of rollers effective for contacting an upper surface and a lower surface of said substrate, respectively; and
a roller heating unit for heating at least one roller of said pair of rollers.

37. The roll coating apparatus of claim 36, wherein:
at least one roller of said pair of rollers has a respective hollow interior extending substantially along the entirety of a width dimension associated with said substrate;
said roller heating unit comprising:
a further pipe means connected to opposite ends of said roller having said hollow interior for communicating with the hollow interior thereof;
a respective heating medium for circulating through said further pipe means and through said hollow interior of said roller;
a further heating unit connected to said further pipe means for heating said heating medium to a prescribed temperature; and
a further circulating means connected to said further pipe means for circulating said heating medium.

38. A roll coating apparatus of claim 32, further comprising substrate heating means for heating said substrate, said substrate heating means comprising means located above said substrate feeding means for supplying heated air to the substrate.

39. The roll coating apparatus of claim 32, wherein said doctor means is in contact with said coating roll and further including:
a second rotatable coating roll disposed generally below and contacting said coating roll and effective for holding said substrate between said coating roll and said second coating roll; and
second doctor means extending generally parallel to an axis of said second coating roll and effective for defining a space between said second doctor means and said second coating roll for storing said coating liquid in said space in a manner allowing said coating liquid to adhere to said second coating roll.

40. The roll coating apparatus of claim 23, wherein said temperature maintaining means comprises supply heating means for heating said coating liquid supply means.

41. The roll coating apparatus of claim 40, wherein said cooling liquid supply means comprises:
a coating liquid tank for storing the coating liquid;
pipe means connecting said tank and communicating with said space; and
nozzle means connected to said pipe means and effective for discharging the coating liquid into said space.

42. The roll coating apparatus of claim 41, said supply heating means comprising covering means for covering said pipe means, and means for supplying the heating medium at the prescribed temperature into said covering means.

43. The roll coating apparatus of claim 42, wherein said supply heating means comprises a respective heating unit connected to said pipe means for heating said heating medium.

44. The roll coating apparatus of claim 40, further comprising substrate heating means, said substrate heating means comprising:
a pair of rotatable rollers located on an upstream side of said coating roll relative to said substrate feeding direction, said pair of rollers effective for contacting an upper surface and a lower surface of said substrate, respectively; and
a roller heating unit for heating at least one roller of said pair of rollers.

45. The roll coating apparatus of claim 44, wherein:
at least one roller of said pair of rollers has a respective hollow interior extending substantially along the entirety of a width dimension associated with said substrate;
said roller heating unit comprising:
a further pipe means connected to opposite ends of said roller having said hollow interior for communicating with the hollow interior thereof;

a respective heating medium for circulating through said further pipe means and through said hollow interior of said roller;

a further heating unit connected to said further pipe means for heating said heating medium to a prescribed temperature; and a further circulating means connected to said further pipe means for circulating said heating medium.

46. A roll coating apparatus of claim 40, further comprising substrate heating means for heating said substrate, said substrate heating means comprising means located above said substrate feeding means for supplying heated air to the substrate.

47. The roll coating apparatus of claim 40, wherein said doctor means is in contact with said coating roll and further including:

a second rotatable coating roll disposed generally below and contacting said coating roll and effective for holding said substrate between said coating roll and said second coating roll; and second doctor means extending generally parallel to an axis of said second coating roll and effective for defining a space between said second doctor means and said second coating roll for storing said coating liquid in said space in a manner allowing said coating liquid to adhere to said second coating roll.

48. A roll coating apparatus for applying a coating liquid of high viscosity at a normal temperature to the surface of a plate substrate being fed thereto, comprising:

means for feeding said substrate to said roll coating apparatus;

a rotatable coating roll extending in a direction intersecting with a direction of feeding said substrate and effective for pressing against said substrate;

doctor means extending parallel to an axis of said coating roll and being disposed adjacent said coating roll in a manner defining a space between a said coating roll and said doctor means for storing said coating liquid thereat, in a manner allowing said coating liquid to adhere to a surface of said coating roll upon rotation thereof;

means for heating said substrate, said heating means including means located over said substrate feeding means and effective for blowing heated air on said substrate; and said coating roll having a circumferential surface and a plurality of axially spaced and circumferentially extending grooves on said surface, said grooves having a pitch of at least 300 $\mu$m and an axial spacing between grooves which is not greater than 80 $\mu$m.

* * * * *